(12) United States Patent
Tanaka et al.

(10) Patent No.: US 7,261,746 B2
(45) Date of Patent: Aug. 28, 2007

(54) INTERMEDIATE PRODUCT MANUFACTURING APPARATUS, AND MANUFACTURING METHOD

(75) Inventors: Shuji Tanaka, Chino (JP); Yoshitake Kobayashi, Shiojiri (JP); Hisashi Fujimura, Chino (JP)

(73) Assignee: Seiko Epson Corporation (JP)

( * ) Notice: Subject to any disclaimer, the term of this patent is extended or adjusted under 35 U.S.C. 154(b) by 222 days.

(21) Appl. No.: 10/814,654

(22) Filed: Mar. 31, 2004

(65) Prior Publication Data

US 2004/0237270 A1    Dec. 2, 2004

(30) Foreign Application Priority Data

Apr. 3, 2003  (JP)  ............................. 2003-100522
Jul. 2, 2003   (JP)  ............................. 2003-190569

(51) Int. Cl.
  *H01L 21/00*   (2006.01)
  *H01L 21/64*   (2006.01)
(52) U.S. Cl. ...................................... 29/25.01
(58) Field of Classification Search ................ 29/25.01
    See application file for complete search history.

(56) References Cited

U.S. PATENT DOCUMENTS

| | | | |
|---|---|---|---|
| 5,292,393 A * | 3/1994 | Maydan et al. | 156/345.32 |
| 5,855,681 A * | 1/1999 | Maydan et al. | 118/719 |
| 6,139,591 A * | 10/2000 | Nakaura et al. | 29/25.01 |
| 6,440,178 B2 * | 8/2002 | Berner et al. | 29/25.01 |
| 6,503,375 B1 * | 1/2003 | Maydan et al. | 204/242 |

FOREIGN PATENT DOCUMENTS

| | | |
|---|---|---|
| JP | 02-078243 | 3/1990 |
| JP | 02-117512 | 5/1990 |
| JP | 06-310424 | 11/1994 |
| JP | 07-122622 | 5/1995 |
| JP | 08-181184 | 7/1996 |
| JP | 11-145022 | 5/1999 |
| JP | 2001-338968 | 12/2001 |
| JP | 2002-237512 | 8/2002 |

OTHER PUBLICATIONS

Communication from Chinese Patent Office regarding corresponding application.

* cited by examiner

*Primary Examiner*—Fernando L. Toledo
(74) *Attorney, Agent, or Firm*—Harness, Dickey & Pierce, P.L.C.

(57) ABSTRACT

A manufacturing apparatus is provided comprising: inter-process carrying means for carrying a container between the process modules in a container unit, the container being capable of storing a plurality of intermediate products therein; intra-process carrying means for removing the intermediate products from the container and carrying the intermediate products within each process module in a single product state; and a plurality of processing means for performing the plurality of processes, respectively, within each process module, wherein the plurality of processing means are arranged substantially in the carrying direction of the intermediate products in accordance with the order of processes to be performed on the intermediate products, without arranging a plurality of processing means for performing the same kinds of processes on the intermediate products in a group.

7 Claims, 23 Drawing Sheets

| | |
|---|---|
| WetET-A | 1 |
| DryET-A | 1 |
| DryET-B | 2 |
| DryET-C | 1 |
| Ash | 2 |
| CLEANING | 1 |
| APPEARANCE INSPECTION | 2 |
| MEASUREMENT OF DIMENSION | 1 |
| MEASUREMENT OF FILM THICKNESS | 1 |

| LAYER | CLEANING PROCESS | FILM FORMING PROCESS | INSPECTION PROCESS | CLEANING PROCESS | ANNEALING PROCESS | CLEANING PROCESS | PHOTOLITHOGRAPHY PROCESS | INSPECTION PROCESS | INSPECTION PROCESS | ION IMPLANTATION PROCESS | ETCHING PROCESS | ETCHING PROCESS | ASHING PROCESS | PEELING PROCESS | INSPECTION PROCESS |
|---|---|---|---|---|---|---|---|---|---|---|---|---|---|---|---|
| 1 | CLEANING A | SPUTTERING A | | CLEANING B | | | PHOTOLITHOGRAPHY A | INSPECTION B | INSPECTION C | | DRY ETCHING A | | ASHING A | PEELING A | INSPECTION B |
| 2 | | CVD-A | INSPECTION A | CLEANING B | ANNEALING A | CLEANING C | PHOTOLITHOGRAPHY A | | | | | | | | |
| 3 | | CVD-B | | CLEANING B | ANNEALING B | CLEANING C | PHOTOLITHOGRAPHY A | INSPECTION B | INSPECTION C | | DRY ETCHING B | | ASHING A | PEELING A | INSPECTION B |
| 4 | CLEANING A | THERMAL OXIDATION A | INSPECTION A | | | | | | | | | | | | |
| 5 | | CVD-C | | | ANNEALING C | | PHOTOLITHOGRAPHY A | | INSPECTION C | ION IMPLANTATION A | | | ASHING A | PEELING A | |
| 6 | CLEANING A | | | | | | PHOTOLITHOGRAPHY A | | INSPECTION C | ION IMPLANTATION A | | | ASHING A | | |
| 7 | | CVD-D | | | ANNEALING D | CLEANING A | PHOTOLITHOGRAPHY A | INSPECTION B | INSPECTION C | | DRY ETCHING B | | ASHING A | PEELING A | INSPECTION B |
| 8 | | | | | | | PHOTOLITHOGRAPHY A | | INSPECTION C | ION IMPLANTATION A | | | ASHING A | PEELING A | |
| 9 | | | | | | | PHOTOLITHOGRAPHY A | | INSPECTION C | ION IMPLANTATION A | | | ASHING A | PEELING A | |
| 10 | | | | | | | PHOTOLITHOGRAPHY A | INSPECTION B | INSPECTION C | ION IMPLANTATION A | | | ASHING A | PEELING A | |
| 11 | CLEANING A | CVD-A | INSPECTION A | | | | PHOTOLITHOGRAPHY A | INSPECTION B | INSPECTION C | | DRY ETCHING C | WET ETCHING A | ASHING A | PEELING A | INSPECTION B |
| 12 | CLEANING A | CVD-D | | | ANNEALING D | | PHOTOLITHOGRAPHY A | INSPECTION B | INSPECTION C | | DRY ETCHING B | | ASHING A | PEELING A | INSPECTION B |
| 13 | CLEANING A | CVD-C | | | | | PHOTOLITHOGRAPHY A | INSPECTION B | INSPECTION C | | DRY ETCHING C | | ASHING A | PEELING A | INSPECTION B |
| 14 | | CVD-D | | | ANNEALING D | CLEANING A | PHOTOLITHOGRAPHY A | INSPECTION B | INSPECTION C | | DRY ETCHING A | | | | INSPECTION B |
| 15 | CLEANING A | SPUTTERING A | | CLEANING B | | | PHOTOLITHOGRAPHY A | INSPECTION B | INSPECTION C | | DRY ETCHING C | WET ETCHING A | ASHING A | PEELING A | INSPECTION B |
| 16 | CLEANING A | CVD-E | | | ANNEALING A | | PHOTOLITHOGRAPHY A | INSPECTION B | INSPECTION C | | DRY ETCHING C | WET ETCHING A | ASHING A | PEELING A | INSPECTION B |
| 17 | | | | | | | PHOTOLITHOGRAPHY A | INSPECTION B | INSPECTION C | | DRY ETCHING C | WET ETCHING A | ASHING A | PEELING A | INSPECTION B |
| 18 | | SPUTTERING B | | | | | PHOTOLITHOGRAPHY A | INSPECTION B | INSPECTION C | | DRY ETCHING D | | | PEELING B | INSPECTION B |
| 19 | | CVD-E | | CLEANING B | ANNEALING E | CLEANING A | PHOTOLITHOGRAPHY A | INSPECTION B | INSPECTION C | | DRY ETCHING C | WET ETCHING A | ASHING A | PEELING A | INSPECTION B |
| 20 | | SPUTTERING C | | CLEANING B | | | PHOTOLITHOGRAPHY A | | | | DRY ETCHING E | | ASHING A | PEELING B | INSPECTION B |
| 21 | | | | | | | PHOTOLITHOGRAPHY A | | INSPECTION C | | | WET ETCHING A | ASHING A | PEELING B | INSPECTION B |

FIG. 11

| PROCESS NO. | LAYER | APPARATUS | PROCESS NO. | LAYER | APPARATUS | PROCESS NO. | LAYER | APPARATUS |
|---|---|---|---|---|---|---|---|---|
| 1 | 1 | CLEANING A | 55 | 8 | ASHING A | 109 | 15 | PEELING A |
| 2 | 1 | SPUTTERING A | 56 | 8 | PEELING A | 110 | 15 | INSPECTION B |
| 3 | 1 | CLEANING B | 57 | 9 | PHOTOLITHOGRAPHY A | 111 | 16 | CLEANING A |
| 4 | 1 | PHOTOLITHOGRAPHY A | 58 | 9 | INSPECTION C | 112 | 16 | CVD-E |
| 5 | 1 | INSPECTION B | 59 | 9 | ION IMPLANTATION A | 113 | 16 | ANNEALING A |
| 6 | 1 | INSPECTION C | 60 | 9 | ASHING A | 114 | 16 | PHOTOLITHOGRAPHY A |
| 7 | 1 | DRY ETCHING A | 61 | 9 | PEELING A | 115 | 16 | INSPECTION B |
| 8 | 1 | ASHING A | 62 | 10 | PHOTOLITHOGRAPHY A | 116 | 16 | INSPECTION C |
| 9 | 1 | PEELING A | 63 | 10 | INSPECTION B | 117 | 16 | DRY ETCHING C |
| 10 | 1 | INSPECTION B | 64 | 10 | INSPECTION C | 118 | 16 | WET ETCHING A |
| 11 | 2 | CVD-A | 65 | 10 | ION IMPLANTATION A | 119 | 16 | ASHING A |
| 12 | 2 | INSPECTION A | 66 | 10 | ASHING A | 120 | 16 | PEELING A |
| 13 | 2 | CLEANING B | 67 | 10 | PEELING A | 121 | 16 | INSPECTION B |
| 14 | 2 | ANNEALING A | 68 | 11 | CLEANING A | 122 | 17 | PHOTOLITHOGRAPHY A |
| 15 | 2 | CLEANING C | 69 | 11 | CVD-A | 123 | 17 | INSPECTION B |
| 16 | 3 | CVD-B | 70 | 11 | INSPECTION A | 124 | 17 | INSPECTION C |
| 17 | 3 | CLEANING B | 71 | 11 | PHOTOLITHOGRAPHY A | 125 | 17 | DRY ETCHING C |
| 18 | 3 | ANNEALING B | 72 | 11 | INSPECTION B | 126 | 17 | WET ETCHING A |
| 19 | 3 | CLEANING C | 73 | 11 | INSPECTION C | 127 | 17 | ASHING A |
| 20 | 3 | PHOTOLITHOGRAPHY A | 74 | 11 | DRY ETCHING C | 128 | 17 | PEELING A |
| 21 | 3 | INSPECTION B | 75 | 11 | WET ETCHING A | 129 | 17 | INSPECTION B |
| 22 | 3 | INSPECTION C | 76 | 11 | ASHING A | 130 | 18 | SPUTTERING B |
| 23 | 3 | DRY ETCHING B | 77 | 11 | PEELING A | 131 | 18 | PHOTOLITHOGRAPHY A |
| 24 | 3 | ASHING A | 78 | 11 | INSPECTION B | 132 | 18 | INSPECTION B |
| 25 | 3 | PEELING A | 79 | 12 | CLEANING A | 133 | 18 | INSPECTION C |
| 26 | 3 | INSPECTION B | 80 | 12 | CVD-D | 134 | 18 | DRY ETCHING D |
| 27 | 4 | CLEANING A | 81 | 12 | ANNEALING D | 135 | 18 | PEELING B |
| 28 | 4 | THERMAL OXIDATION A | 82 | 12 | CLEANING A | 136 | 18 | INSPECTION B |
| 29 | 4 | INSPECTION A | 83 | 12 | PHOTOLITHOGRAPHY A | 137 | 19 | CVD-E |
| 30 | 5 | CVD-C | 84 | 12 | INSPECTION B | 138 | 19 | CLEANING B |
| 31 | 5 | ANNEALING C | 85 | 12 | INSPECTION C | 139 | 19 | ANNEALING E |
| 32 | 5 | PHOTOLITHOGRAPHY A | 86 | 12 | DRY ETCHING B | 140 | 19 | CLEANING A |
| 33 | 5 | INSPECTION C | 87 | 12 | ASHING A | 141 | 19 | PHOTOLITHOGRAPHY A |
| 34 | 5 | ION IMPLANTATION A | 88 | 12 | PEELING A | 142 | 19 | INSPECTION B |
| 35 | 5 | ASHING A | 89 | 12 | INSPECTION B | 143 | 19 | INSPECTION C |
| 36 | 5 | PEELING A | 90 | 13 | CLEANING A | 144 | 19 | DRY ETCHING C |
| 37 | 6 | PHOTOLITHOGRAPHY A | 91 | 13 | CVD-C | 145 | 19 | WET ETCHING A |
| 38 | 6 | INSPECTION C | 92 | 13 | PHOTOLITHOGRAPHY A | 146 | 19 | ASHING A |
| 39 | 6 | ION IMPLANTATION A | 93 | 13 | INSPECTION B | 147 | 19 | PEELING A |
| 40 | 6 | ASHING A | 94 | 13 | INSPECTION C | 148 | 19 | INSPECTION B |
| 41 | 7 | CLEANING A | 95 | 13 | DRY ETCHING C | 149 | 20 | SPUTTERING C |
| 42 | 7 | CVD-D | 96 | 13 | ASHING A | 150 | 20 | CLEANING B |
| 43 | 7 | ANNEALING D | 97 | 13 | PEELING A | 151 | 20 | PHOTOLITHOGRAPHY A |
| 44 | 7 | CLEANING A | 98 | 13 | INSPECTION B | 152 | 20 | INSPECTION B |
| 45 | 7 | PHOTOLITHOGRAPHY A | 99 | 14 | CVD-D | 153 | 20 | INSPECTION C |
| 46 | 7 | INSPECTION B | 100 | 14 | ANNEALING D | 154 | 20 | DRY ETCHING E |
| 47 | 7 | INSPECTION C | 101 | 14 | CLEANING A | 155 | 20 | ASHING A |
| 48 | 7 | DRY ETCHING B | 102 | 15 | SPUTTERING A | 156 | 20 | PEELING B |
| 49 | 7 | ASHING A | 103 | 15 | CLEANING B | 157 | 20 | INSPECTION B |
| 50 | 7 | PEELING A | 104 | 15 | PHOTOLITHOGRAPHY A | 158 | 21 | PHOTOLITHOGRAPHY A |
| 51 | 7 | INSPECTION B | 105 | 15 | INSPECTION B | 159 | 21 | INSPECTION C |
| 52 | 8 | PHOTOLITHOGRAPHY A | 106 | 15 | INSPECTION C | 160 | 21 | WET ETCHING A |
| 53 | 8 | INSPECTION C | 107 | 15 | DRY ETCHING A | 161 | 21 | ASHING A |
| 54 | 8 | ION IMPLANTATION A | 108 | 15 | ASHING A | 162 | 21 | PEELING B |
| | | | | | | 163 | 21 | INSPECTION B |

FIG. 12

| APPARATUS | NUMBER OF APPARATUSES | |
|---|---|---|
| | 2,500 SHEETS/MONTH | 10,000 SHEETS/MONTH |
| CVD-A | 1 | 3 |
| CVD-B | 1 | 1 |
| CVD-C | 1 | 1 |
| CVD-D | 1 | 2 |
| CVD-E | 1 | 1 |
| ASHING A | 2 | 6 |
| ANNEALING A | 1 | 2 |
| ANNEALING B | 1 | 2 |
| ANNEALING C | 1 | 2 |
| ANNEALING D | 1 | 2 |
| ANNEALING E | 1 | 3 |
| ION IMPLANTATION A | 1 | 3 |
| WET ETCHING A | 1 | 2 |
| INSPECTION A | 1 | 1 |
| INSPECTION B | 2 | 5 |
| INSPECTION C | 1 | 4 |
| SPUTTERING A | 1 | 2 |
| SPUTTERING B | 1 | 1 |
| SPUTTERING C | 1 | 2 |
| CLEANING A | 1 | 3 |
| CLEANING B | 1 | 2 |
| CLEANING C | 1 | 2 |
| DRY ETCHING A | 1 | 2 |
| DRY ETCHING B | 1 | 2 |
| DRY ETCHING C | 1 | 3 |
| DRY ETCHING D | 1 | 2 |
| DRY ETCHING E | 1 | 1 |
| THERMAL OXIDATION A | 1 | 2 |
| PEELING A | 1 | 4 |
| PEELING B | 1 | 2 |
| PHOTOLITHOGRAPHY A | 2 | 6 |
| TOTAL | 34 | 76 |

| | FLOW-SHOP PROCESS CONSTRUCTION (2,500 SHEETS/MONTH) | | | | | | | | | | | | | | |
|---|---|---|---|---|---|---|---|---|---|---|---|---|---|---|---|
| | FIRST FLOW-SHOP FS1 | | | | | | SECOND FLOW-SHOP FS2 | | | | | | | | |
| LAYER | CLEANING PROCESS | FILM FORMING PROCESS | INSPECTION PROCESS | CLEANING PROCESS | ANNEALING PROCESS | CLEANING PROCESS | PHOTOLITHOGRAPHY PROCESS | INSPECTION PROCESS | INSPECTION PROCESS | ION IMPLANTATION PROCESS | ETCHING PROCESS | ETCHING PROCESS | ASHING PROCESS | PEELING PROCESS | INSPECTION PROCESS |
| 1 | CLEANING A | SPUTTERING A | | CLEANING B | | | PHOTOLITHOGRAPHY A | INSPECTION B | INSPECTION C | | DRY ETCHING A | | ASHING A | PEELING A | INSPECTION B |
| 2 | | CVD-A | INSPECTION A | CLEANING B | ANNEALING A | CLEANING C | PHOTOLITHOGRAPHY A | INSPECTION B | INSPECTION C | | | | | | |
| 3 | | CVD-B | | CLEANING B | ANNEALING B | CLEANING C | PHOTOLITHOGRAPHY A | | | | DRY ETCHING B | | ASHING A | PEELING A | INSPECTION B |
| 4 | CLEANING A | THERMAL OXIDATION A | INSPECTION A | | | | | | | | | | | | |
| 5 | | CVD-C | | | ANNEALING C | | PHOTOLITHOGRAPHY A | | INSPECTION C | ION IMPLANTATION A | | | ASHING A | PEELING A | |
| 6 | | | | | | | PHOTOLITHOGRAPHY A | | INSPECTION C | ION IMPLANTATION A | | | ASHING A | | |
| 7 | CLEANING A | CVD-D | | | ANNEALING D | CLEANING A | PHOTOLITHOGRAPHY A | INSPECTION B | INSPECTION C | ION IMPLANTATION A | DRY ETCHING B | | ASHING A | PEELING A | INSPECTION B |
| 8 | | | | | | | PHOTOLITHOGRAPHY A | | INSPECTION C | ION IMPLANTATION A | | | ASHING A | PEELING A | |
| 9 | | | | | | | PHOTOLITHOGRAPHY A | | INSPECTION C | ION IMPLANTATION A | | | ASHING A | PEELING A | |
| 10 | CLEANING A | | | | ANNEALING D | CLEANING A | PHOTOLITHOGRAPHY A | | INSPECTION C | | | | ASHING A | PEELING A | |
| 11 | CLEANING A | CVD-A | INSPECTION A | | | | PHOTOLITHOGRAPHY A | INSPECTION B | INSPECTION C | | DRY ETCHING A | WET ETCHING C | ASHING A | PEELING A | INSPECTION B |
| 12 | CLEANING A | CVD-D | | | ANNEALING D | CLEANING A | | INSPECTION B | INSPECTION C | | DRY ETCHING B | | ASHING A | PEELING A | INSPECTION B |
| 13 | CLEANING A | CVD-C | | | | | PHOTOLITHOGRAPHY A | INSPECTION B | INSPECTION C | | DRY ETCHING C | | ASHING A | PEELING A | INSPECTION B |
| 14 | CLEANING A | CVD-D | | | | | | INSPECTION B | INSPECTION C | | DRY ETCHING D | | | | |
| 15 | | SPUTTERING A | | CLEANING B | | | PHOTOLITHOGRAPHY A | INSPECTION B | INSPECTION C | | DRY ETCHING A | WET ETCHING A | ASHING A | PEELING A | INSPECTION B |
| 16 | CLEANING A | CVD-E | | | ANNEALING A | | PHOTOLITHOGRAPHY A | INSPECTION B | INSPECTION C | | DRY ETCHING C | WET ETCHING C | ASHING A | PEELING A | INSPECTION B |
| 17 | | | | | | | PHOTOLITHOGRAPHY A | INSPECTION B | INSPECTION C | | DRY ETCHING C | WET ETCHING C | ASHING A | PEELING A | INSPECTION B |
| 18 | | SPUTTERING B | | | | | PHOTOLITHOGRAPHY A | INSPECTION B | INSPECTION C | | DRY ETCHING D | | | PEELING B | INSPECTION B |
| 19 | | CVD-E | | CLEANING B | ANNEALING E | CLEANING A | PHOTOLITHOGRAPHY A | INSPECTION B | INSPECTION C | | DRY ETCHING C | WET ETCHING C | ASHING A | PEELING A | INSPECTION B |
| 20 | | SPUTTERING C | | CLEANING B | | | PHOTOLITHOGRAPHY A | INSPECTION B | INSPECTION C | | DRY ETCHING E | | ASHING A | PEELING B | INSPECTION B |
| 21 | | | | | | | PHOTOLITHOGRAPHY A | | INSPECTION C | | | WET ETCHING A | ASHING A | PEELING B | INSPECTION B |

FIRST FLOW-SHOP FS1

(A)

| APPARATUS | NUMBER OF APPARATUSES |
|---|---|
| CVD-A | 1 |
| CVD-B | 1 |
| CVD-C | 1 |
| CVD-D | 1 |
| CVD-E | 1 |
| ANNEALING A | 1 |
| ANNEALING B | 1 |
| ANNEALING C | 1 |
| ANNEALING D | 1 |
| ANNEALING E | 1 |
| INSPECTION A | 1 |
| SPUTTERING A | 1 |
| SPUTTERING B | 1 |
| SPUTTERING C | 1 |
| CLEANING A | 2 |
| CLEANING B | 1 |
| CLEANING C | 1 |
| THERMAL OXIDATION A | 1 |
| TOTAL | 19 |

SECOND FLOW-SHOP FS2

(B)

| APPARATUS | NUMBER OF APPARATUSES |
|---|---|
| ASHING A | 2 |
| ION IMPLANTATION A | 1 |
| WET ETCHING A | 1 |
| INSPECTION B | 2 |
| INSPECTION C | 1 |
| DRY ETCHING A | 1 |
| DRY ETCHING B | 1 |
| DRY ETCHING C | 1 |
| DRY ETCHING D | 1 |
| DRY ETCHING E | 1 |
| PEELING A | 1 |
| PEELING B | 1 |
| PHOTOLITHOGRAPHY A | 2 |
| TOTAL | 16 |

FIG. 18

FLOW-SHOP PROCESS CONSTRUCTION (10,000 SHEETS/MONTH)

| LAYER | FIRST FLOW-SHOP FS1 ||| SECOND FLOW-SHOP FS2 ||| THIRD FLOW-SHOP FS3 ||||| FOURTH FLOW-SHOP FS4 ||||
|---|---|---|---|---|---|---|---|---|---|---|---|---|---|---|---|
| | CLEANING PROCESS | FILM FORMING PROCESS | INSPECTION PROCESS | CLEANING PROCESS | ANNEALING PROCESS | CLEANING PROCESS | PHOTOLITHOGRAPHY PROCESS | INSPECTION PROCESS | INSPECTION PROCESS | ION IMPLANTATION PROCESS | ETCHING PROCESS | ETCHING PROCESS | ASHING PROCESS | PEELING PROCESS | INSPECTION PROCESS |
| 1 | CLEANING A | SPUTTERING A | | CLEANING B | | | PHOTOLITHOGRAPHY A | INSPECTION B | INSPECTION C | | DRY ETCHING A | | ASHING A | PEELING A | INSPECTION B |
| 2 | | CVD-A | INSPECTION A | CLEANING B | ANNEALING A | CLEANING C | | | | | | | | | |
| 3 | | CVD-B | | CLEANING B | ANNEALING B | CLEANING C | PHOTOLITHOGRAPHY A | INSPECTION B | INSPECTION C | | DRY ETCHING B | | ASHING A | PEELING A | INSPECTION B |
| 4 | CLEANING A | THERMAL OXIDATION A | INSPECTION A | | | | | | | | | | | | |
| 5 | | CVD-C | | | ANNEALING C | | PHOTOLITHOGRAPHY A | | INSPECTION C | ION IMPLANTATION A | | | ASHING A | PEELING A | |
| 6 | | | | | | | PHOTOLITHOGRAPHY A | | INSPECTION C | ION IMPLANTATION A | | | ASHING A | | |
| 7 | CLEANING A | CVD-D | | | ANNEALING D | CLEANING A | PHOTOLITHOGRAPHY A | INSPECTION B | INSPECTION C | | DRY ETCHING B | | ASHING A | PEELING A | INSPECTION B |
| 8 | | | | | | | PHOTOLITHOGRAPHY A | | INSPECTION C | ION IMPLANTATION A | | | ASHING A | PEELING A | |
| 9 | | | | | | | PHOTOLITHOGRAPHY A | | INSPECTION C | ION IMPLANTATION A | | | ASHING A | PEELING A | |
| 10 | | | | | | | PHOTOLITHOGRAPHY A | INSPECTION B | INSPECTION C | ION IMPLANTATION A | | | ASHING A | PEELING A | |
| 11 | CLEANING A | CVD-A | INSPECTION A | | | | PHOTOLITHOGRAPHY A | INSPECTION B | INSPECTION C | | DRY ETCHING A | WET ETCHING A | ASHING A | PEELING A | INSPECTION B |
| 12 | CLEANING A | CVD-D | | | ANNEALING D | | PHOTOLITHOGRAPHY A | INSPECTION B | INSPECTION C | | DRY ETCHING B | | ASHING A | PEELING A | INSPECTION B |
| 13 | CLEANING A | CVD-C | | | | | PHOTOLITHOGRAPHY A | INSPECTION B | INSPECTION C | | DRY ETCHING C | | ASHING A | PEELING A | INSPECTION B |
| 14 | | CVD-D | | | ANNEALING D | CLEANING A | PHOTOLITHOGRAPHY A | INSPECTION B | INSPECTION C | | | | | | |
| 15 | | SPUTTERING A | | CLEANING B | | | PHOTOLITHOGRAPHY A | INSPECTION B | INSPECTION C | | DRY ETCHING A | WET ETCHING A | ASHING A | PEELING A | INSPECTION B |
| 16 | CLEANING A | CVD-E | | | ANNEALING A | | PHOTOLITHOGRAPHY A | INSPECTION B | INSPECTION C | | DRY ETCHING C | WET ETCHING A | ASHING A | PEELING A | INSPECTION B |
| 17 | | | | | | | PHOTOLITHOGRAPHY A | INSPECTION B | INSPECTION C | | DRY ETCHING C | WET ETCHING A | ASHING A | PEELING A | INSPECTION B |
| 18 | | SPUTTERING B | | | | | PHOTOLITHOGRAPHY A | INSPECTION B | INSPECTION C | | DRY ETCHING D | | | PEELING B | INSPECTION B |
| 19 | | CVD-E | | CLEANING B | ANNEALING E | CLEANING A | PHOTOLITHOGRAPHY A | INSPECTION B | INSPECTION C | | DRY ETCHING C | WET ETCHING A | ASHING A | PEELING A | INSPECTION B |
| 20 | | SPUTTERING C | | CLEANING B | | | PHOTOLITHOGRAPHY A | INSPECTION B | INSPECTION C | | DRY ETCHING E | | ASHING A | PEELING B | INSPECTION B |
| 21 | | | | | | | PHOTOLITHOGRAPHY A | | INSPECTION C | | | WET ETCHING A | ASHING A | PEELING B | INSPECTION B |

| FIRST FLOW-SHOP | |
|---|---|
| APPARATUS | NUMBER OF APPARATUSES |
| CVD-A | 3 |
| CVD-B | 1 |
| CVD-C | 1 |
| CVD-D | 2 |
| CVD-E | 1 |
| THERMAL OXIDATION A | 2 |
| INSPECTION A | 1 |
| SPUTTERING A | 2 |
| SPUTTERING B | 1 |
| SPUTTERING C | 2 |
| CLEANING A | 2 |
| TOTAL | 18 |

(B)

| SECOND FLOW-SHOP | |
|---|---|
| APPARATUS | NUMBER OF APPARATUSES |
| ANNEALING A | 2 |
| ANNEALING B | 2 |
| ANNEALING C | 2 |
| ANNEALING D | 3 |
| ANNEALING E | 1 |
| CLEANING A | 2 |
| CLEANING B | 2 |
| CLEANING C | 2 |
| TOTAL | 16 |

(C)

| THIRD FLOW-SHOP | |
|---|---|
| APPARATUS | NUMBER OF APPARATUSES |
| PHOTOLITHOGRAPHY A | 6 |
| INSPECTION B | 3 |
| INSPECTION C | 4 |
| ION IMPLANTATION A | 3 |
| TOTAL | 16 |

(D)

| FOURTH FLOW-SHOP | |
|---|---|
| APPARATUS | NUMBER OF APPARATUSES |
| DRY ETCHING A | 2 |
| DRY ETCHING B | 2 |
| DRY ETCHING C | 3 |
| DRY ETCHING D | 2 |
| DRY ETCHING E | 1 |
| WET ETCHING A | 2 |
| ASHING A | 6 |
| PEELING A | 4 |
| PEELING B | 2 |
| INSPECTION B | 3 |
| TOTAL | 27 |

FIG. 21

| APPARATUS | NUMBER OF APPARATUSES | |
|---|---|---|
| | 2,500 SHEETS/MONTH | 10,000 SHEETS/MONTH |
| CVD-A | 2 | 3 |
| CVD-B | 1 | 1 |
| CVD-C | 2 | 2 |
| CVD-D | 3 | 3 |
| CVD-E | 2 | 2 |
| ASHING A | 17 | 17 |
| ANNEALING A | 2 | 2 |
| ANNEALING B | 1 | 2 |
| ANNEALING C | 1 | 2 |
| ANNEALING D | 3 | 3 |
| ANNEALING E | 1 | 3 |
| ION IMPLANTATION A | 5 | 5 |
| WET ETCHING A | 5 | 5 |
| INSPECTION A | 3 | 3 |
| INSPECTION B | 26 | 26 |
| INSPECTION C | 18 | 18 |
| SPUTTERING A | 2 | 2 |
| SPUTTERING B | 1 | 1 |
| SPUTTERING C | 1 | 2 |
| CLEANING A | 11 | 11 |
| CLEANING B | 6 | 6 |
| CLEANING C | 2 | 2 |
| DRY ETCHING A | 2 | 2 |
| DRY ETCHING B | 3 | 3 |
| DRY ETCHING C | 5 | 5 |
| DRY ETCHING D | 1 | 2 |
| DRY ETCHING E | 1 | 1 |
| THERMAL OXIDATION A | 1 | 2 |
| PEELING A | 14 | 14 |
| PEELING B | 3 | 3 |
| PHOTOLITHOGRAPHY A | 18 | 18 |
| TOTAL | 163 | 171 |

| APPARATUS | SMALL-SCALE AMOUNT OF PRODUCTION (ABOUT 2,500 SHEETS/MONTH) | | | MIDDLE-SCALE AMOUNT OF PRODUCTION (ABOUT 10,000 SHEETS/MONTH) | | |
|---|---|---|---|---|---|---|
| | JOB-SHOP | COMPLETE FLOW-SHOP | FLOW-SHOP ACCORDING TO THE PRESENT EMBODIMENT | JOB-SHOP | COMPLETE FLOW-SHOP | FLOW-SHOP ACCORDING TO THE PRESENT EMBODIMENT |
| CVD-A | 1 | 2 | 1 | 3 | 3 | 3 |
| CVD-B | 1 | 1 | | 1 | 1 | 1 |
| CVD-C | 1 | 2 | 1 | 1 | 2 | 1 |
| CVD-D | 1 | 3 | 1 | 2 | 3 | 2 |
| CVD-E | 1 | 2 | 1 | 1 | 2 | 1 |
| ASHING A | 2 | 17 | 2 | 6 | 17 | 6 |
| ANNEALING A | 1 | 2 | 1 | 2 | 2 | 2 |
| ANNEALING B | 1 | 1 | 1 | 2 | 2 | 2 |
| ANNEALING C | 1 | 1 | 1 | 2 | 2 | 2 |
| ANNEALING D | 1 | 3 | 1 | 2 | 3 | 2 |
| ANNEALING E | 1 | 1 | 1 | 3 | 3 | 3 |
| ION IMPLANTATION A | 1 | 5 | 1 | 3 | 5 | 3 |
| WET ETCHING A | 1 | 5 | 1 | 2 | 5 | 2 |
| INSPECTION A | 1 | 3 | 1 | 1 | 3 | 1 |
| INSPECTION B | 2 | 26 | 2 | 5 | 26 | 6 |
| INSPECTION C | 1 | 18 | 1 | 4 | 18 | 4 |
| SPUTTERING A | 1 | 2 | 1 | 2 | 2 | 2 |
| SPUTTERING B | 1 | 1 | 1 | 1 | 1 | 1 |
| SPUTTERING C | 1 | 1 | 1 | 2 | 2 | 2 |
| CLEANING A | 1 | 11 | 2 | 3 | 11 | 3 |
| CLEANING B | 1 | 6 | 1 | 2 | 6 | 2 |
| CLEANING C | 1 | 2 | 1 | 2 | 2 | 2 |
| DRY ETCHING A | 1 | 2 | 1 | 2 | 2 | 2 |
| DRY ETCHING B | 1 | 3 | 1 | 2 | 3 | 2 |
| DRY ETCHING C | 1 | 5 | 1 | 3 | 5 | 3 |
| DRY ETCHING D | 1 | 2 | 1 | 2 | 2 | 2 |
| DRY ETCHING E | 1 | 1 | 1 | 1 | 1 | 1 |
| THERMAL OXIDATION A | 1 | 2 | 1 | 2 | 2 | 2 |
| PEELING A | 1 | 14 | 1 | 4 | 14 | 4 |
| PEELING B | 1 | 3 | 1 | 2 | 3 | 2 |
| PHOTOLITHOGRAPHY A | 2 | 18 | 2 | 6 | 18 | 6 |
| TOTAL | 34 | 163 | 35 | 76 | 171 | 77 |

INTERMEDIATE PRODUCT MANUFACTURING APPARATUS, AND MANUFACTURING METHOD

RELATED APPLICATIONS

This application claims priority to Japanese Patent Application Nos. 2003-100522 filed Apr. 3, 2003 and 2003-190569 filed Jul. 2, 2003 which are expressly incorporated by reference herein in their entireties.

BACKGROUND

1. Technical Field of the Invention

The present invention relates to a manufacturing apparatus and a manufacturing method for manufacturing an intermediate product via process modules for performing a plurality of processes.

2. Description of the Related Art

Conventionally, substrates for liquid crystal display devices are manufactured, for example, by using processes for manufacturing semiconductor wafers. The conventional processes for manufacturing semiconductor wafers mainly include wafer manufacturing processes, wafer processing processes, assembly processes, and inspection processes. In the wafer processing processes, which are also called pre-process, a plurality of processes are repeatedly performed on the semiconductor wafers.

In conventional preprocess, a plurality of semiconductor wafers are stored in cassettes, and the wafers are carried in a cassette unit. Further, in the conventional preprocess, a manufacture scheme called a flow-shop is employed in some parts thereof (for example, see Japanese Unexamined Patent Application Publication No. 11-145022), instead of a manufacture scheme called a job-shop in which a plurality of processing apparatuses for performing the same kinds of processes on the semiconductor wafers for the manufacture are arranged in a group.

The job-shop has an advantage in that it is easy to maintain and manage the processing apparatuses, but also has a disadvantage in that it takes a long period of time to carry the semiconductor wafers between the processing apparatuses. On the contrary, in a flow-shop, since a plurality of processing apparatuses are arranged in the carrying direction of the semiconductor wafers in the order of processes to be performed on the semiconductor wafers, it is possible to reduce the carrying time.

Nowadays, as a consequence of the transition from a time when a few different kinds of products were produced in great quantities to a time when a variety of products are produced in small quantities, a manufacture scheme called a flow-shop, described above, can be applied to a portion of the preprocess, but cannot be applied to all of the processes. This is because the processing apparatuses with different processing times are mixed in each process module. That is, when all of the processes are performed using the flow-shop scheme, there are problems in that the processing speed for all of the processes is lowered in accordance with a processing apparatus with a low processing speed. On the contrary, for example, while only one processing apparatus with a high processing speed may be required for the job-shop, a plurality of the processing apparatuses may be required for the flow-shop, necessitating an increased investment cost.

Therefore, the present invention is designed to solve the above problems and to provide a manufacturing apparatus and a manufacturing method for efficiently processing intermediate products.

SUMMARY

According to a first aspect of the present invention, there is provided a manufacturing apparatus for manufacturing an intermediate product via process modules for performing a plurality of processes, the apparatus comprising: an inter-process carrying means for carrying a container between the process modules, the container being capable of storing a plurality of intermediate products therein; an intra-process carrying means for removing the intermediate products from the container and carrying the intermediate products within each process module in a single product state; and a plurality of processing means for performing the plurality of processes, respectively, in each process module, wherein the plurality of processing means are arranged substantially in a carrying direction of the intermediate products in accordance with the order of processes to be performed on the intermediate products, without arranging the plurality of processing means for performing the same kinds of processes on the intermediate products in a group.

According to the above construction, by using a container capable of storing a plurality of intermediate products as a unit, the containers are carried between the process modules, and the intermediate products are removed from the containers in each process module. Then, the intermediate products are carried within each process module in a single product state. The plurality of processing means are arranged substantially in the carrying direction of the intermediate products in accordance with the order of processes to be performed on the intermediate products, without arranging the plurality of processing means for performing the same kinds of processes on the intermediate products in a group. For this reason, when the intermediate products are carried in the carrying direction, the plurality of processing means can efficiently perform the plurality of processes, respectively. Therefore, it is not necessary to repeatedly circulate the intermediate products within the process modules as in the conventional art, and for example, through one circulation, the intermediate products are efficiently subjected to a series of continuous processes. In each process module, since the intermediate products are carried in a single product state, not in a container unit, it is possible to manufacture a variety of intermediate products in small quantities.

According to a second aspect of the present invention, in the construction of the first aspect, a transfer means provided between the inter-process carrying means and the intra-process carrying means and having a buffering function of temporarily storing the intermediate products to be transferred therein may be further included.

According to the above construction, the intermediate products can be temporarily stored, corresponding to the carrying situation of the intermediate products between the process modules by the inter-process carrying means or to the carrying situation of the intermediate products within the process modules by the intra-process carrying means. Therefore, the transfer means can efficiently transfer the intermediate products between the inter-process carrying means and the intra-process carrying means, corresponding to the carrying situation of the intermediate products being carried.

According to a third aspect of the present invention, in the construction of the first or second aspect, the inter-process carrying means may carry a container even before the maximum number of intermediate products capable of being stored in the container is reached, and the intra-process carrying means may select the plurality of intermediate products to be processed in the same next process module, store the selected intermediate products in the container in a bundle, and transfer the container to the inter-process carrying means.

According to the above construction, since the plurality of intermediate products to be processed in the same next process module are stored in a bundle in the same container and are then carried between the process modules, it is possible to more efficiently carry the intermediate products, compared with cases in which the plurality of intermediate products to be processed in different next process modules are mixed and then the intermediate products are carried between the process modules. Furthermore, according to the above construction, since it is possible to minimize the wait time when the maximum number of intermediate products capable of being stored in the container is reached and then the intermediate products are carried in a container unit, that is, the wait time for completion of processes on other intermediate products to be stored in the same container, it is possible to considerably reduce the lead time, compared with the conventional case.

According to a fourth aspect of the present invention, in the construction of any one of the first to third aspects, the intermediate products may be plate-shaped members.

According to the above construction, it is not necessary to repeatedly circulate the plate-shaped intermediate products within the process modules as in the conventional case, and, for example, through only one circulation, it is possible to efficiently perform a series of continuous processes thereon. Accordingly, since the carrying time of the plate-shaped intermediate products is shortened, particles are hardly attached to the plate-shaped intermediate products. Furthermore, since the carrying time is shortened, it is also possible to considerably reduce the lead time.

According to a fifth aspect of the present invention, in the construction of the fourth aspect, the intermediate products may be semiconductor wafers.

According to the above construction, it is not necessary to repeatedly circulate the semiconductor wafers within the process modules as in the conventional case, and, for example, through only one circulation, it is possible to efficiently perform a series of continuous processes thereon. Accordingly, since the carrying time of the semiconductor wafers is shortened, particles are hardly attached to the semiconductor wafers. Furthermore, since the carrying time is shortened, it is also possible to considerably reduce the lead time.

According to a sixth aspect of the present invention, in the construction of the fourth aspect, the intermediate products may be substrates for liquid crystal display devices.

According to the above construction, it is not necessary to repeatedly circulate the substrates for liquid crystal display devices within the process modules as in the conventional case, and, for example, through only one circulation, it is possible to efficiently perform a series of continuous processes thereon. Accordingly, since the carrying time of the substrates for the liquid crystal display devices is shortened, particles are not attached well to the substrates for liquid crystal display devices. Furthermore, since the carrying time is shortened, it is also possible to considerably reduce the lead time.

According to a seventh aspect of the present invention, there is provided a manufacturing method of manufacturing an intermediate product via process modules for performing a plurality of processes, the method comprising: an inter-process carrying step of carrying a container between the process modules, the container being capable of storing a plurality of intermediate products therein; an intra-process carrying step of removing the intermediate products from the container and carrying the intermediate products within each process module in a single product state; and a processing step of performing the plurality of processes by a plurality of processing means, respectively, in each process module, wherein the plurality of processing means are arranged substantially in a carrying direction of the intermediate products in accordance with the order of processes to be performed on the intermediate products, without arranging a plurality of processing means for performing the same kinds of processes on the intermediate products in a group.

BRIEF DESCRIPTION OF THE DRAWINGS

FIG. 11 is a chart illustrating an example of processes to be performed on the semiconductor wafers.

FIG. 12 is a chart illustrating an example in which the processes shown in FIG. 11 are arranged in a time series.

FIG. 15 is a diagram illustrating an example of the number of processing apparatuses required in a case where the processing apparatuses are arranged in accordance with the job-shop.

FIG. 16 is a chart illustrating an example of the order of processes to be performed on the semiconductor wafers when an embodiment of the present invention is employed.

FIG. 18 is a diagram illustrating an example of the number of processing apparatuses included in the flow-shop bay shown in FIG. 17.

FIG. 19 is a chart illustrating an example of the order of processes to be performed on the semiconductor wafers when an embodiment of the present invention is employed.

FIG. 21 is a diagram illustrating an example of a layout of the processing apparatuses in accordance with the flow-shop shown in FIG. 19.

FIG. 23 is a diagram illustrating an example of the number of processing apparatuses required for the layout shown in FIG. 22.

FIG. 24 is a diagram illustrating a comparative example of the number of the processing apparatuses required corresponding to the kinds of the layouts.

DETAILED DESCRIPTION

Now, preferred embodiments of the present invention will be described with reference to the accompanying drawings.

Figure 1:
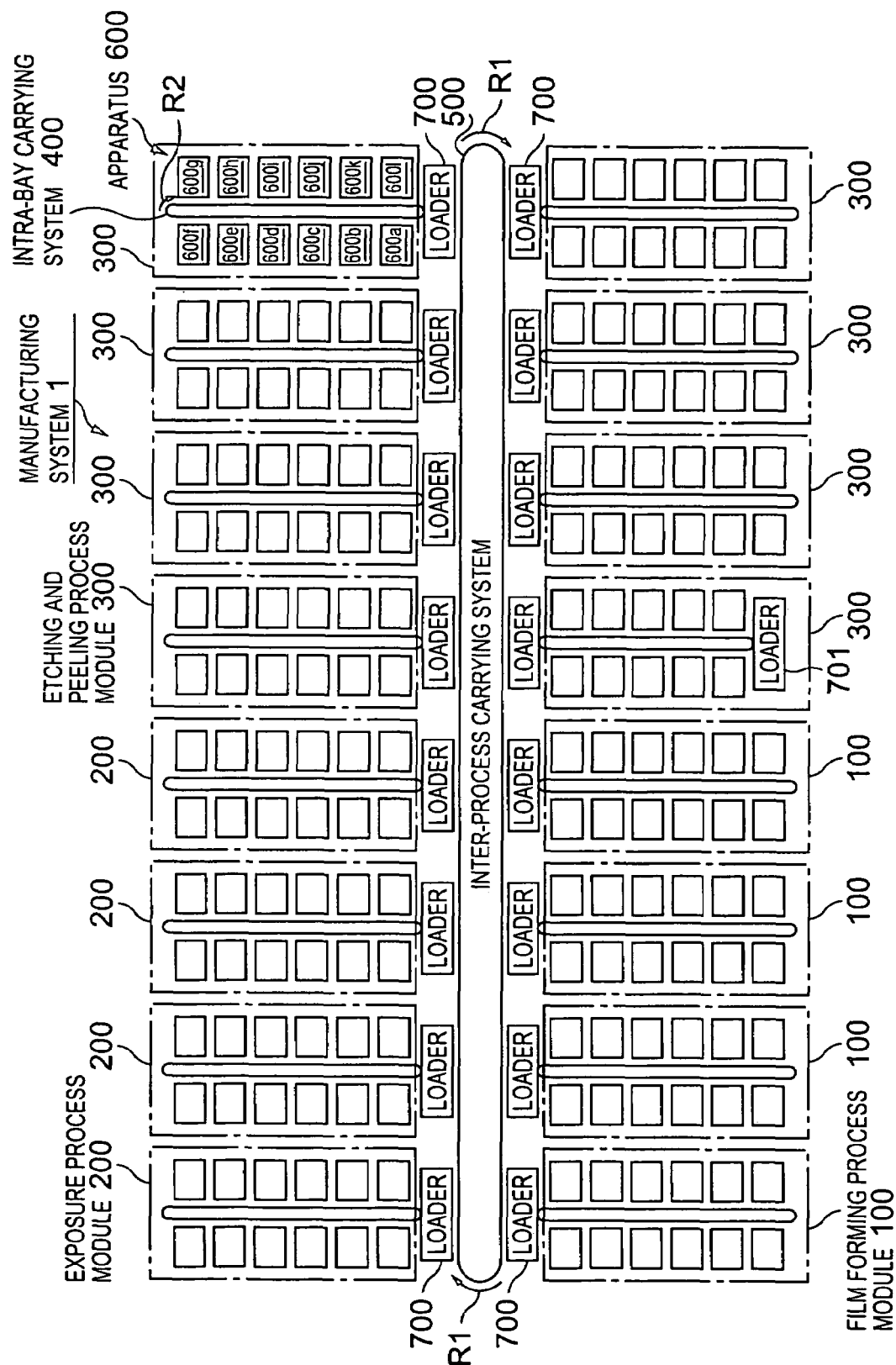
FIG. 1 is a plan view illustrating a constructional example of a manufacturing system.

FIG. 1 is a plan view illustrating a constructional example of a manufacturing system 1 to which a manufacturing apparatus according to a preferred embodiment of the present invention is applied.

The manufacturing system 1 is a manufacturing facility for manufacturing intermediate products via process modules for performing a plurality of processes. These intermediate products may include, for example, semiconductor wafers which are plate-shaped members. In addition, the intermediate products may include, for example, substrates for liquid crystal display devices.

In the facility shown in the figure, for example, exposure process modules 200, etching and peeling process modules 300, and film forming process modules 100 are arranged on both sides of an inter-process carrying system 500. Each of the modules 200 exists in a clean room, and the inside of the clean room is managed into a predetermined cleanliness level (a cleanliness class), for example, by down-flow.

In the following description, the term 'inter-process' refers to modules between processes, such as the exposure process module 200, the etching and peeling process module 300, and the film forming process module 100, and the term 'intra-process' refers to the interiors of the process modules, such as the exposure process module 200, etc. Furthermore, a 'process module' may be also called a 'bay'. An intra-bay carrying system 400 arranged radially from the inter-process carrying system 500 is provided in each module 200, etc. The inter-process carrying system 500 is a carrying system used when it is intended to carry the semiconductor wafers between the process modules, such as the exposure process modules 200, etc., that is, above the intra-bay carrying system 400.

In the inter-process carrying system 500, for example, a plurality of semiconductor wafers are stored in front-opening unified pods (hereinafter, referred to as 'cassettes') called FOUPs (Front Opening Unified Pod), which are an example of a container, and the cassettes are carried by an automatic carrying robot called an AGV (Auto Guide Vehicle), not shown.

In the inter-process carrying system 500, the automatic carrying robot is circulated in a direction R1. Alternatively, instead of the automatic carrying robot, such as an AGV, the cassettes may be carried by an automatic carrying vehicle of a ceiling-traveling type called an OHS (Over Head Shuttle), or by an automatic carrying vehicle of a ceiling-suspended type called an OHT (Overhead Hoist Transport).

Loaders 700 are provided between the inter-process carrying system 500 and the intra-bay carrying systems 400. Each loader 700 has a load function of acquiring the cassettes carried through the inter-process carrying system 500, removing the semiconductor wafers stored in the cassettes one by one, and transferring the semiconductor wafers to the intra-bay carrying system 400 one by one.

In addition, each loader 700 has an unload function of acquiring the semiconductor wafers carried one by one through the intra-bay carrying systems 400, storing the semiconductor wafers in the cassettes, and transferring the cassettes to the inter-process carrying system 500. As a result, within the respective process modules, since the semiconductor wafers are carried in a single wafer state, not in a cassette, by the intra-bay carrying system 400, a wide variety of semiconductor wafers can be manufactured in small quantities.

Furthermore, the loader 700 may have a buffering function of temporarily storing the semiconductor wafers between the inter-process carrying system and the intra-process carrying system. As a result, the semiconductor wafers can be temporarily stored, corresponding to a situation where the semiconductor wafers are carried between the process modules by the inter-process carrying system 500, or a situation where the semiconductor wafers are carried in each process module by the intra-bay carrying system 400. The loader 700 can efficiently transfer the semiconductor wafers between the inter-process carrying system 500 and the intra-bay carrying system 400 using the buffer function, corresponding to the carrying situation of the intermediate products being carried.

Processing apparatuses 600a to 600l (600) for performing processes on the semiconductor wafers in each process module are arranged at both sides of the intra-bay carrying system 400. The processing apparatuses 600a to 600l are arranged in the carrying direction in which the intra-bay carrying system 400 carries the semiconductor wafers. The processing apparatuses 600a to 600l are processing apparatuses for performing predetermined processes on the semiconductor wafers to form circuits, etc., thereon, respectively.

This embodiment of the present invention is characterized in that the processing apparatuses 600a to 600l are arranged substantially in the carrying direction R2 of the semiconductor wafers in accordance with the order of processes to be performed on the semiconductor wafers, instead of arranging the processing apparatuses for performing the same kinds of processes on the semiconductor wafers, which are an example of the intermediate products, in a group as in the conventional case.

As a result, when the semiconductor wafers are carried in the carrying direction, the processing apparatuses 600a to 600l can efficiently perform a plurality of processes, respectively. In the conventional case, the following carrying operation is repeated: that is, the semiconductor wafers are carried to a stocker of a loader 700 in the current process bay by the intra-bay carrying system 400, are carried to the stocker of a loader 700 in the next process bay by the inter-process carrying system 500, and then are carried to the processing apparatuses 600a to 600l by the intra-bay carrying system 400 in the next process bay. However, according to the present embodiment, the semiconductor wafers are efficiently subjected to a series of continuous processes, for example, through only one circulation. Accordingly, since the carrying time of the semiconductor wafers is shortened, particles are hardly attached to the semiconductor wafers.

Further, since the carrying time is shortened, it is also possible to considerably reduce the lead time (inter-process time).

Figure 2A:
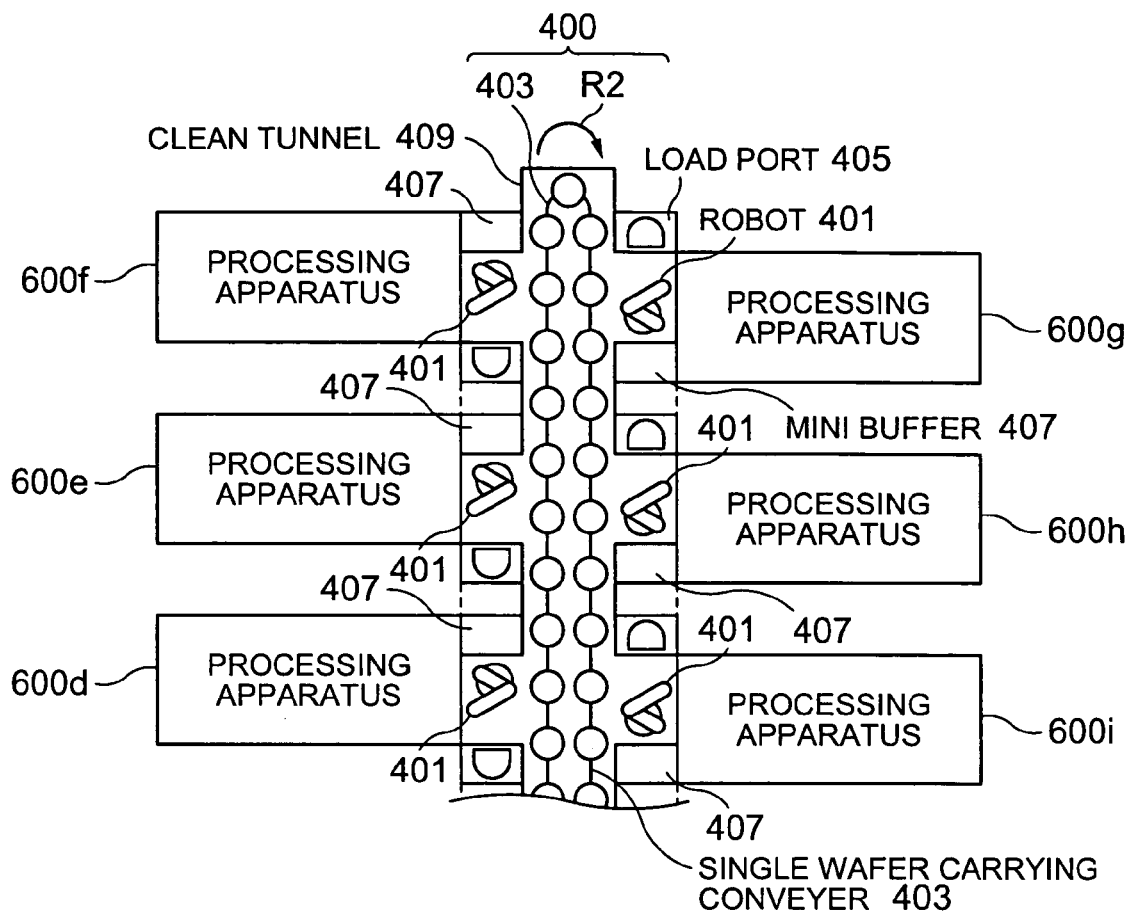
FIGS. 2A–B are diagrams illustrating a constructional example of peripheries of an intra-bay carrying system shown in FIG. 1 and a cross-sectional view thereof.
Figure 2B:
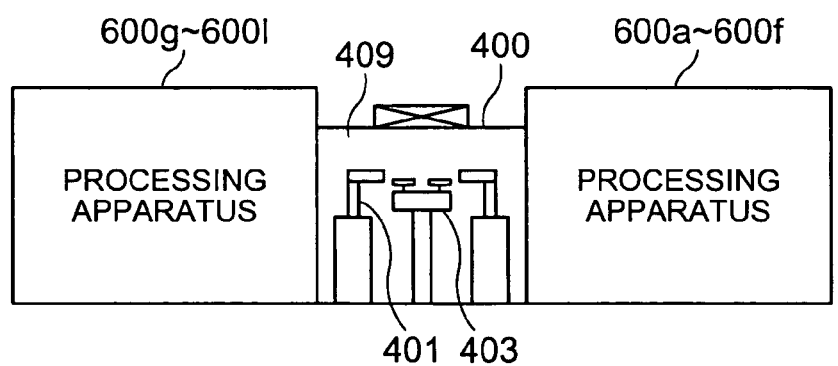

FIG. 2(A) is a diagram illustrating a constructional example of peripheries of the intra-bay carrying system 400 shown in FIG. 1, and FIG. 2(B) is a cross-sectional view illustrating the constructional example of the peripheries of the intra-bay carrying system 400 shown in FIG. 2(A).

As described above, the processing apparatuses 600a to 600l for performing a plurality of processes on the semiconductor wafers, respectively, are arranged at both sides of the intra-bay carrying system 400.

The intra-bay carrying system 400 has a construction in which a single wafer conveyer 403 is built in a clean tunnel 409. The inside of the clean tunnel 409 is set to a cleanliness level higher than that of the inside of the clean room. The intra-bay carrying system 400 comprises the single wafer carrying conveyer 403. In the following description, 'single wafer carrying' means that the semiconductor wafers are carried in a single wafer state. The single wafer carrying conveyer 403 has a function of carrying the semiconductor wafers stored in the cassette transferred from the loader 700 shown in FIG. 1 in the R2 direction in a single wafer state.

On the other hand, each of the processing apparatuses 600a to 600l shown in FIG. 2(A) has, for example, a load port 405, a robot 401, and a mini buffer 407. The robots 401 are provided in the processing apparatus 600a, etc., and acquire the semiconductor wafers carried, one by one, by the single wafer carrying conveyer 403 to transfer the acquired semiconductor wafers to one of the corresponding processing apparatuses 600a to 600l. Specifically, the robot 401 reads out, for example, identifiers attached to the semiconductor wafers, and selects and acquires the semiconductor wafers to be processed.

In addition, each robot 401 has a function of acquiring the processed semiconductor wafers from one of the processing apparatuses 600a to 600l and restoring the acquired semiconductor wafers to the single wafer carrying conveyer 403 one by one. The mini buffer 407 is a place for temporarily storing the semiconductor wafers when the robot 401 acquires the semiconductor wafers from the single wafer carrying conveyer 403 or from one of the processing apparatuses 600a to 600l. Further, the mini buffer 407 has a buffering function that the robot 401 temporarily stores the semiconductor wafers therein. The load port 405 has a function as a load port of cassettes (for example, FOUPs, described above) to which an operator loads works when the single wafer carrying conveyer 403 is stopped, or when the respective processing apparatuses 600a to 600l are independently operated.

Specifically, when the robot 401 is intended to restore the semiconductor wafers from the processing apparatus 600a, etc., to the single wafer carrying conveyer 403, but the single wafer carrying conveyer 403 does not have an empty place, the mini buffer 407 temporarily stores the semiconductor wafers therein. On the contrary, when the robot 401 acquires the semiconductor wafers from the single wafer carrying conveyer 403, but the semiconductor wafers cannot be processed directly by the processing apparatus 600a, etc., the mini buffer 407 temporarily stores the semiconductor wafers therein.

The manufacturing system 1 has the aforementioned structure, and an example of the manufacturing method as an operational example thereof will now be described with reference to FIGS. 1 and 2.

Figures 3, 4:
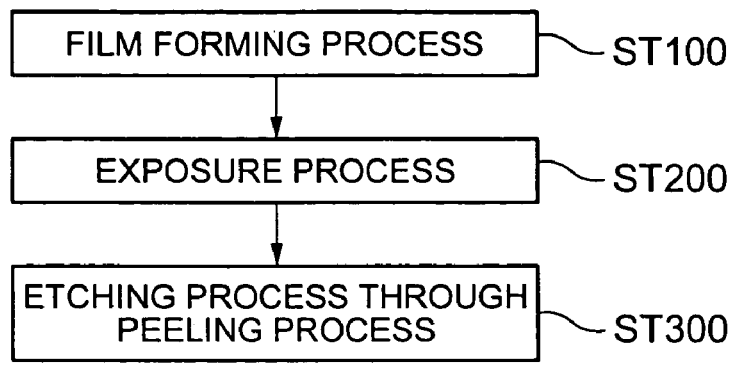
FIG. 3 is a flowchart illustrating an example of the order of main processes.
FIG. 4 is a diagram illustrating an example of the kinds and number of processing apparatuses.

FIG. 3 is a flowchart illustrating an example of the order of a big process in the method of manufacturing a semiconductor wafer. That is, FIG. 3 shows the outline of the so-called preprocess for the semiconductor wafers, and it is needless to say that the large process may be a post-process or other process.

The preprocess in manufacturing the semiconductor wafers has, for example, a film forming process (step ST100), an exposure process (step ST200), and an etching and peeling process (step ST300). The film forming process in the step ST100 is a process of forming films on a semiconductor substrate. The exposure process in the step ST200 is a process of applying resist to the film-formed semiconductor substrate and exposing it to light. The etching process in the step ST300 is a process of etching the exposed semiconductor substrate. In addition, the peeling process in the step ST300 is a process of peeling off the resist.

Now, the etching and peeling process module 300 will be described with reference to a specific example.

FIG. 4 is a diagram illustrating an example of the kinds and the number of processing apparatuses included in the etching and peeling process module 300, and FIGS. 5, 7, 8, and 9 are diagrams illustrating arrangement examples of the processing apparatuses in the etching and peeling process module 300, respectively.

FIGS. 6(A) to 6(C) are diagrams illustrating examples of the manufacture flow in the etching and peeling process module 300, respectively.

Abbreviated expressions in FIGS. 4, 5, 7, 8, and 9 are as follows. First, 'WetET' indicates a wet etching process, and 'DryET' indicates a dry etching process. 'A' is a sign for identifying the process apparatuses having the same function. 'Ash' indicates an ashing process, and 'cleaning' indicates a process of cleaning the semiconductor wafer. 'Appearance inspection' indicates a process of inspecting appearances, 'dimension measurement' indicates a process of measuring dimensions, and 'film thickness measurement' indicates a process of measuring the thickness of a film formed on the semiconductor wafer.

Figure 5:
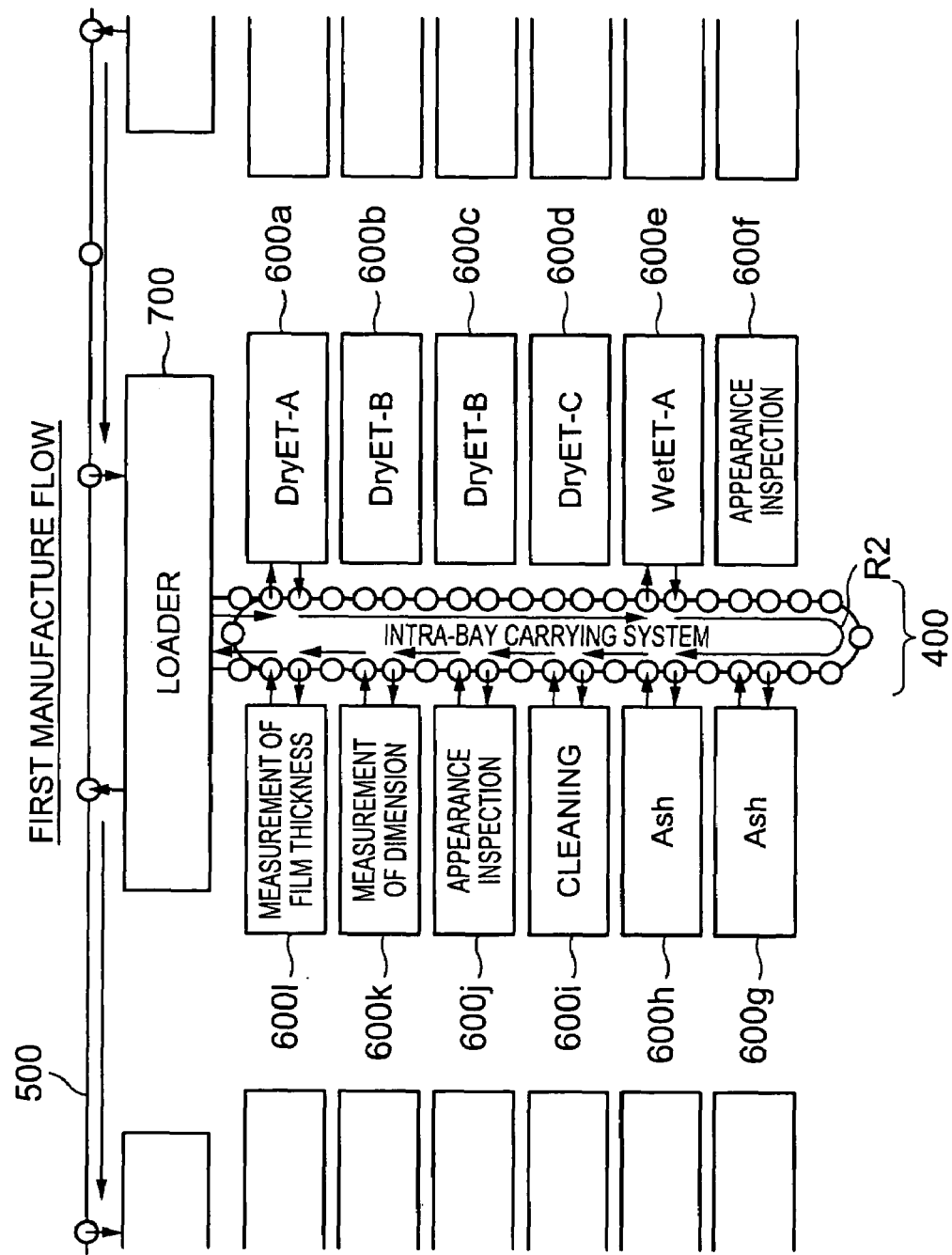
FIG. 5 is a diagram illustrating an example of arrangement of the processing apparatuses.

As shown in FIG. 5, for example, three manufacture flows are exemplified. Since one or a combination of the processing apparatuses 600a, etc., required for processing the semiconductor wafers is selected and used in each manufacture flow, the processing apparatuses 600a, etc., used in the respective manufacture flows may be somewhat different. A feature of this embodiment is that one kind of semiconductor wafer is processed in different manufacture flows, and similar manufacture flows are performed in one bay in a bundle.

Therefore, in the present embodiment, the processing apparatuses 600a to 600l of the etching and peeling process module are arranged as shown in FIG. 5. Specifically, as described above, instead of arranging the processing apparatuses for performing the same kinds of processes on the semiconductor wafers, which are an example of the intermediate products, in a group as in the conventional case, the processing apparatuses 600a to 600l are arranged substantially in the carrying direction R2 of the semiconductor wafers in accordance with the order of processes to be performed on the semiconductor wafers.

First, in the film forming process module 100 shown in FIG. 1, films are formed on semiconductor substrates for the semiconductor wafers, and then the loader 700 having a load function and an unload function stores the plurality of semiconductor wafers in a cassette and transfers the cassette to the inter-process carrying system 500. The inter-process carrying system 500 carries the plurality of semiconductor wafers in a bundle to the etching and peeling process module 300 in a cassette unit.

In the etching and peeling process module 300, the loader 700 shown in FIG. 5 acquires the cassette from the inter-process carrying system 500 and takes in the semiconductor wafers one by one from the cassette. Then, the loader 700 transfers the semiconductor wafers to the intra-bay carrying system 400 to allow the intra-bay carrying system 400 to carry the semiconductor wafers between the processing apparatuses 600a, etc.

Next, in a first manufacture flow shown in FIG. 6(A), as indicated by an arrow in FIG. 5, the semiconductor wafers are processed by the respective processing apparatuses 600a, 600e, 600h, 600i, 600j, 600k, and 600l. The processes on the semiconductor wafers, which are intermediate products, are completed through one circulation in the direction R2 by the intra-bay carrying system 400. Accordingly, since the carrying time of the semiconductor wafers is shortened, particles are not attached well to the semiconductor wafers. Furthermore, since the carrying time is shortened, it is also possible to considerably reduce the lead time.

In addition, since the semiconductor wafers are carried in a single wafer unit by the intra-bay carrying system 400, a process delay hardly occurs in the respective processing apparatuses 600a, etc., compared with the conventional case in which the semiconductor wafers are carried in a cassette unit within a bay. Furthermore, even if only as many processing apparatuses as shown in FIG. 4 are provided, the processing apparatuses 600a, etc., can be efficiently used when arranged in accordance with the manufacturing processes of the semiconductor wafers to be manufactured.

Figure 6:
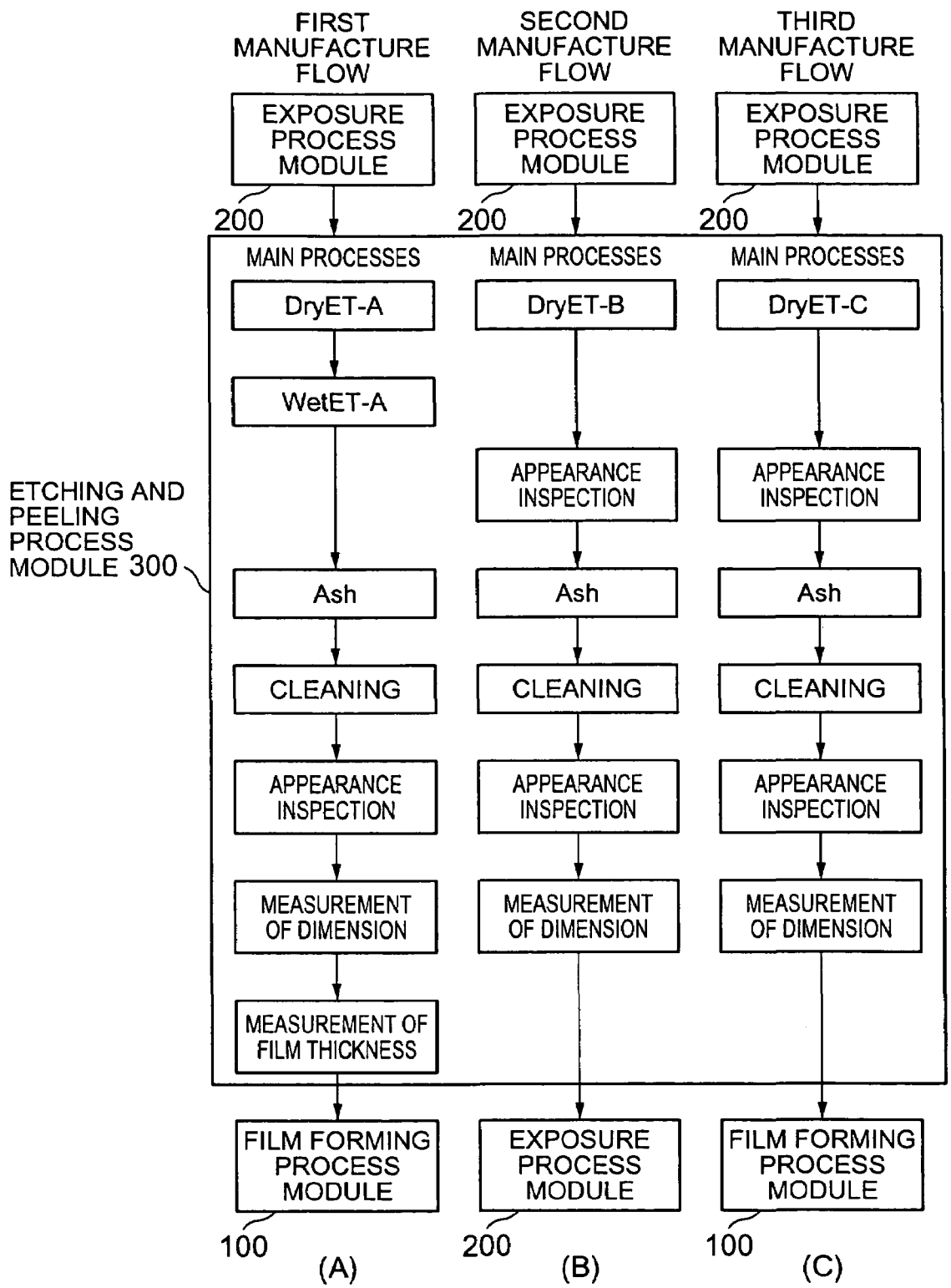
FIG. 6 is a diagram illustrating an example of a manufacture flow.
Figure 7:
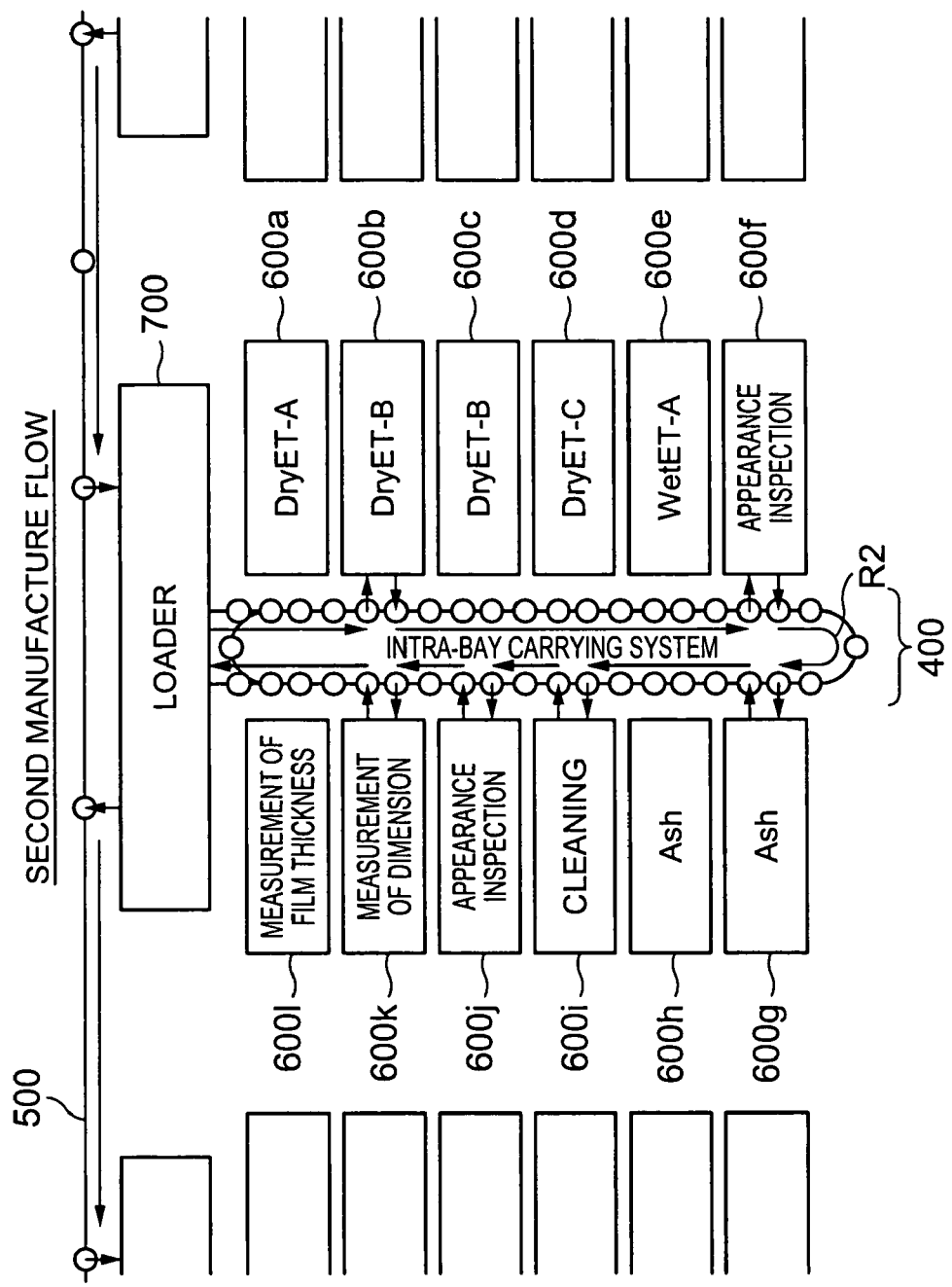
FIG. 7 is a diagram illustrating an example of arrangement of the processing apparatuses.

Further, in a second manufacture flow shown in FIG. 6(B), the semiconductor wafers circulate in one turn through the processing apparatuses 600b, 600f, 600g, 600i, 600j, and 600k in this order by the intra-bay carrying system 400 as shown in FIG. 7 and thus are processed. In the second manufacture flow shown in FIG. 6(B), the semiconductor wafers circulate in one turn through the processing apparatuses 600c, 600f, 600h, 600i, 600j, and 600k in this order by the intra-bay carrying system 400 as shown in FIG. 8 and thus are processed.

Figure 8:
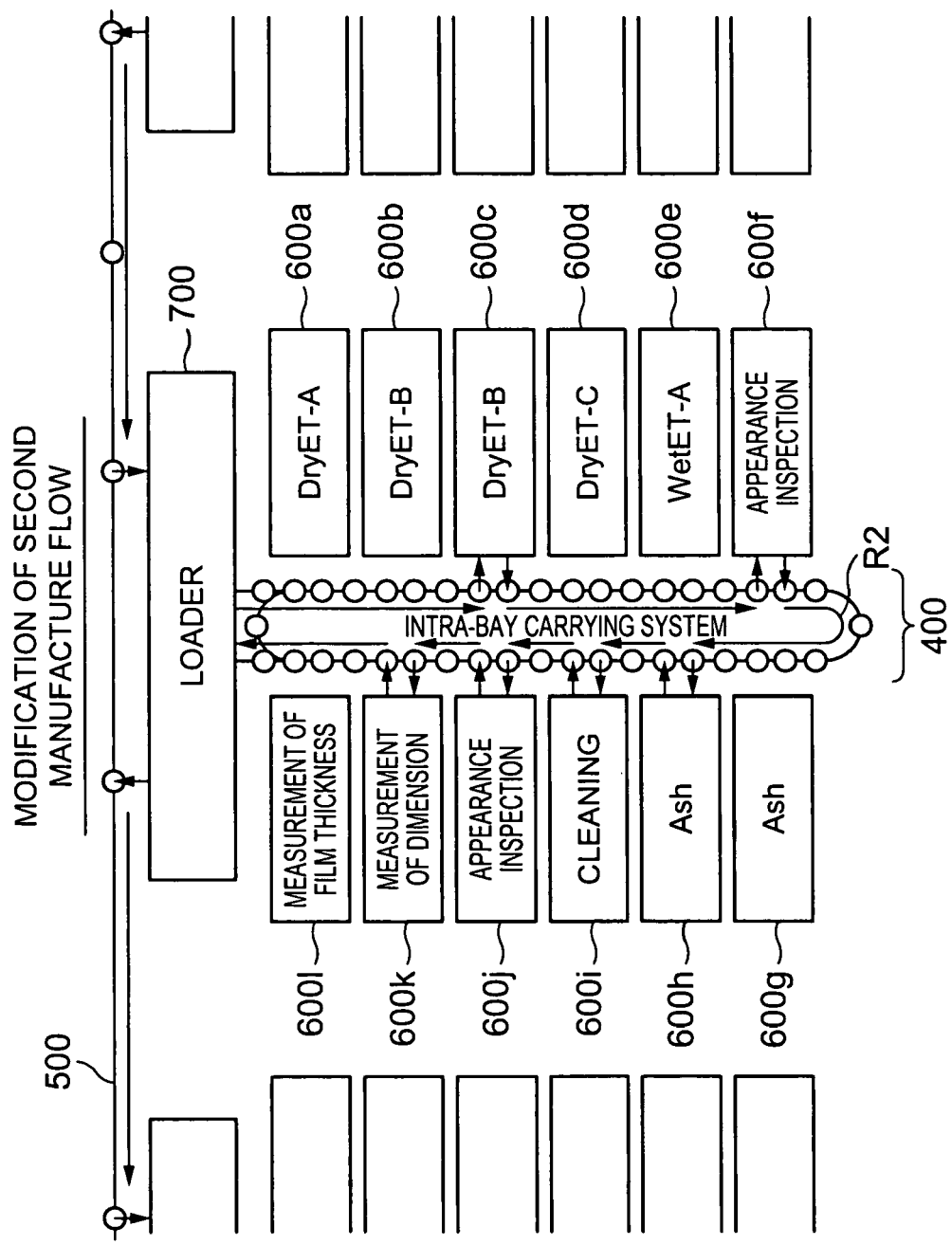
FIG. 8 is a diagram illustrating an example of arrangement of the processing apparatuses.
Figure 9:
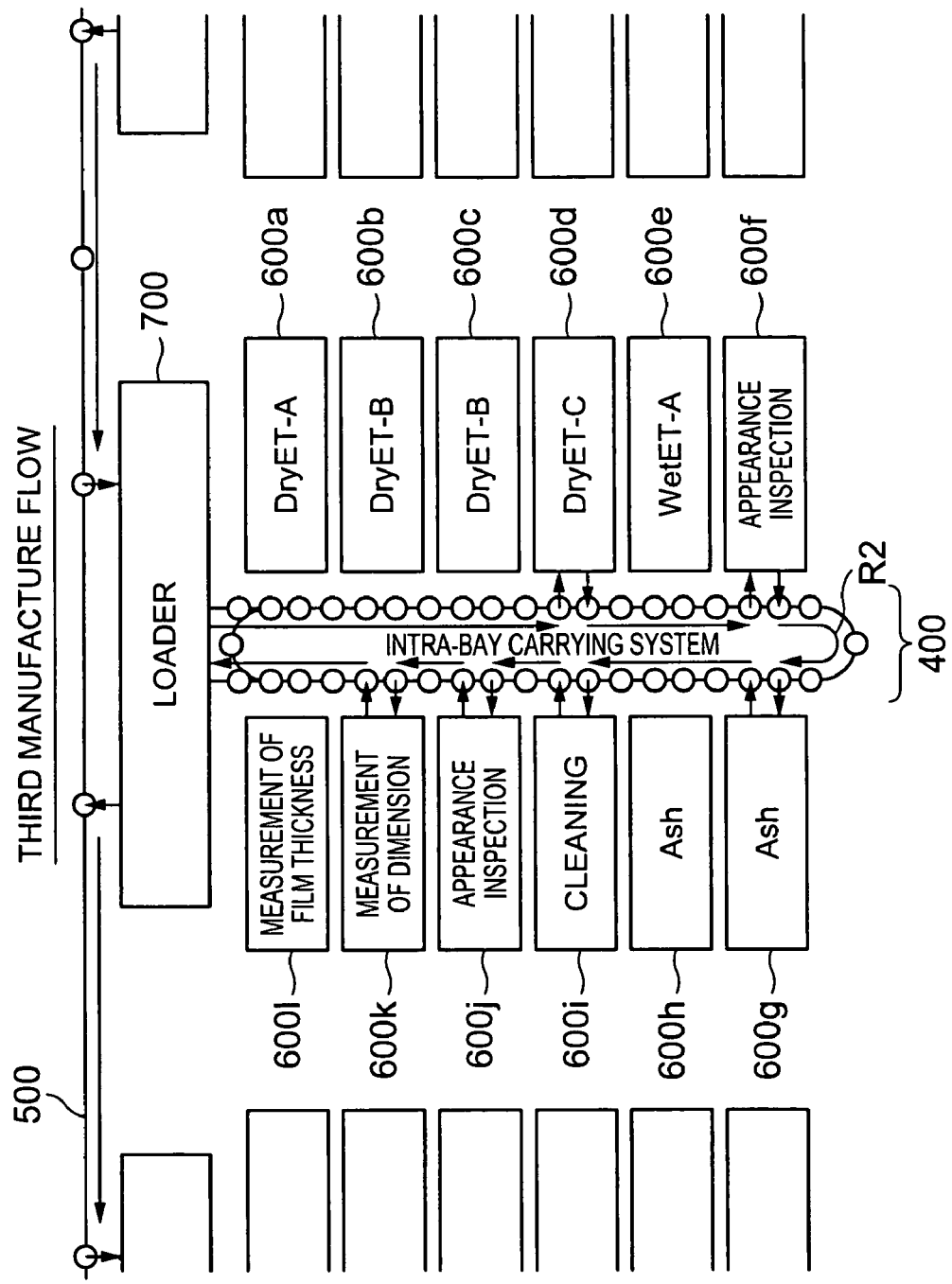
FIG. 9 is a diagram illustrating an example of arrangement of the processing apparatuses.

Since the processing apparatuses 600a, etc., shown in FIG. 8 are arranged substantially in the order of processes on the semiconductor wafers, the processing apparatus 600c shown in FIG. 8 for performing a similar process is used instead of the processing apparatus 600b shown in FIG. 7, and the processing apparatus 600h shown in FIG. 8 for performing a similar process is used instead of the processing apparatus 600g shown in FIG. 7. Furthermore, in a third manufacture flow shown in FIG. 6(C), the semiconductor wafers circulate in one turn through the processing apparatuses 600d, 600f, 600g, 600i, 600j, and 600k in this order by the intra-bay carrying system 400 as shown in FIG. 9 and thus are processed.

According to this embodiment of the present invention, the carrying time of wafers is shortened compared with that of the conventional carrying method using the job-shop. Furthermore, since the same processing apparatuses 600a to 600l are shared, the number of new processing apparatuses to be additionally provided may not increase even if the number of processes on a semiconductor wafer to be manufactured increases. Moreover, since the flow-shop can be applied to all of the processes within the process modules through a combination of the single wafer carrying and the flow-shops sharing the processing apparatuses 600a to 600l, it is possible to considerably reduce the lead time.

In addition, it is possible to efficiently perform the processes on the intermediate products using less circulations within a process module. That is, it is not necessary to repeatedly circulate the semiconductor wafers within the process modules as in the conventional case, and, for example, by only one circulation, a series of continuous processes can be efficiently performed on the semiconductor wafers. Furthermore, since the semiconductor wafers are carried in a single wafer unit, not in a cassette unit, within a process module, it is possible to manufacture a variety of intermediate products in small quantities.

Figure 10:
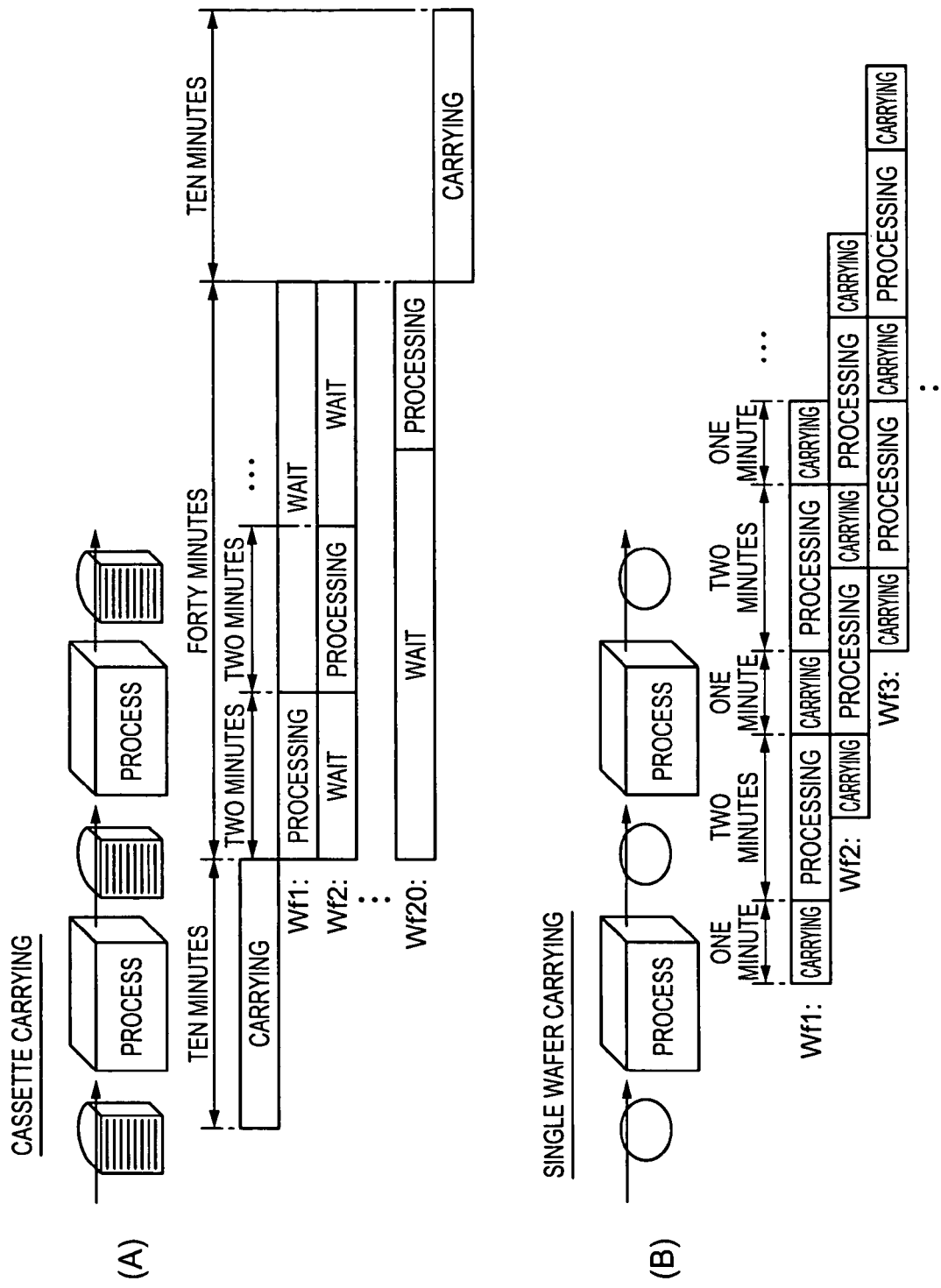
FIG. 10 is a diagram illustrating a comparative example of processing time on the semiconductor wafers.

Further, for example, suppose that twenty sheets of semiconductor wafers are processed. Then, in the conventional case, as shown in FIG. 10(A), it takes two minutes for processing one sheet of semiconductor wafers Wf1, ten minutes for carrying a cassette, and about 10.4 days for processing the twenty sheets of semiconductor wafers through the process module 300. On the contrary, in this embodiment of the present invention, as shown in FIG. 10(B), suppose that it takes one minute for carrying the semiconductor wafers Wf1, etc., and two minutes for processing one sheet of semiconductor wafers, it takes about 0.6 days for processing the twenty sheets of semiconductor wafers through the process module 300, so that it is possible to considerably reduce TAT (Turn Around Time). Therefore, according to this embodiment of the present invention, it is possible to process a variety of semiconductor wafers in small quantities for a shorter period of time.

SECOND EMBODIMENT

In a manufacturing apparatus and a manufacturing method according to a second embodiment of the present invention, elements indicated by the same reference numerals as those in FIGS. 1 to 10 have substantially the same constructions, the same reference numerals as those in FIGS. 1 to 10 are used for the same constructions. Therefore, the description thereof will be omitted, and the following description will be focused on different points.

The second embodiment is characterized in that the inter-process carrying system 500 carries a cassette even before the maximum number of semiconductor wafers capable of being stored in the cassette is reached. Here, the intra-process carrying system 400 may select a plurality of semiconductor wafers to be processed in the same next process module, store the selected semiconductor wafers in the cassette in a bundle, and then transfer the cassette to the inter-process carrying system 500. That is, the plurality of semiconductor wafers to be processed in the same next process module is stored in the same cassette in a bundle and is then carried between the process modules.

Specifically speaking with reference to FIG. 6, in the first manufacture flow shown in FIG. 6(A), the next process module successive to the etching and peeling process module 300 is the film forming process module 100, and in the third manufacture flow shown in FIG. 6(C), the next process module successive to the etching and peeling process module 300 is also the film forming process module 100. Therefore, the first manufacture flow and the third manufacture flow have a commonality in that the next process module successive to the etching and peeling process module 300 is the film forming process module 100.

In the second embodiment, when the next process module is common, the intra-process carrying system 400 selects a plurality of semiconductor wafers to be performed in the same next process module, stores the selected semiconductor wafers in a cassette in a bundle, and then transfers the cassette to the inter-process carrying system 500.

At that time, it is preferable that the inter-process carrying system 500 does not employ, for example, a conception of lot that the maximum semiconductor wafers capable of being stored in a cassette be stored in the cassette, but employs a construction that the cassette be carried even before the semiconductor wafers are fully stored in the cassette. This is because it causes an increase of the lead time when the carrying of the cassette by the inter-process carrying system 500 is delayed until the plurality of semiconductor wafers to be processed in the same next process module are fully stored in the cassette.

In the second embodiment, since the lot unit carrying using containers such as cassettes or FOUPs is not employed, it is possible to shorten the total lead time of the preprocess. Further, in the second embodiment, since the carrying unit is not, for example, a lot corresponding to a recent tendency of single wafer processing of processing apparatuses, it is possible to speed up processing, compared with the one lot unit processing. This is because, from the view point of the respective wafers in a lot, it is not necessary to wait uselessly for completion of the processes on the other wafers, and it is thus possible to prevent a large loss of time in the whole preprocess.

According to the second embodiment of the present invention, it is possible to obtain advantages substantially similar to those of the first embodiment, and in addition, it is possible to carry the semiconductor wafers more efficiently, compared with a case in which a plurality of semiconductor wafers to be performed in different next process modules are mixed and stored, and are then carried between the process modules. Further, according to the second embodiment, since the wait time caused when the maximum semiconductor wafers capable of being stored in a cassette are fully stored in the cassette and are then carried in a cassette unit, that is, the time for waiting for completion of the other semiconductor wafers to be stored in the cassette, can be saved, it is possible to considerably shorten the lead time, compared with the conventional case.

Verification of the Number of New Processing Apparatuses to be Increased

Next, in this embodiment of the present invention, it is verified whether the number of new processing apparatuses to be additionally provided may not increase even if the number of processes on the semiconductor wafers to be manufactured increases as described above.

FIGS. 11 and 12 are diagrams illustrating an example of the order of processes on the semiconductor wafers. In this verification, processes of forming TFT (Thin Film Transistor) arrays on a semiconductor wafer are exemplified.

FIG. 11 illustrates the order of processes for forming, for example, a twenty-one layered film on the semiconductor wafer, and FIG. 12 illustrates an example of processes arranged in the order of processes shown in FIG. 11 in a time series. In FIGS. 11 and 12, names of processes are abbreviated. In the respective processes, for example, 'A', 'B', . . . , 'E', etc., attached to the same process name are identifiers for identifying the same process name.

In order to form a first layer, for example, a cleaning A, a sputtering A, a cleaning B, a photolithography A, an inspection B, an inspection C, a dry etching (dry) A, an ashing A, a peeling A, and an inspection B are performed on a semiconductor wafer. Further, in order to form a second layer, for example, a CVD (Chemical Vapor Deposition) A, an inspection A, a cleaning B, an annealing A, and a cleaning C are performed. Similarly, in order to form the third to twenty-first layers, the processes shown in the figure are performed. That is, processes No. 1 to No. 163 as shown in FIG. 12 are performed on the semiconductor wafer. Accordingly, for example, different combinations of processes for the respective layers are performed on the semiconductor wafer. Therefore, as described later, the arrangement of the processing apparatuses for performing the processes is important.

Next, in a case in which the processes described above are performed on the semiconductor wafer, the number of processing apparatuses required when the number of semiconductor wafers to be manufactured is changed is verified. This verification is performed in cases in which 2,500 sheets of semiconductor wafers are manufactured per month, and in cases in which 10,000 sheets of semiconductor wafers are manufactured per month. As arrangements of the processing apparatuses, an arrangement according to the aforementioned job-shop, an arrangement according to the complete flow-shop, and an arrangement according to this embodiment are exemplified.

Case in Which Processing Apparatuses are Arranged according to Job-Shop

Figure 13:
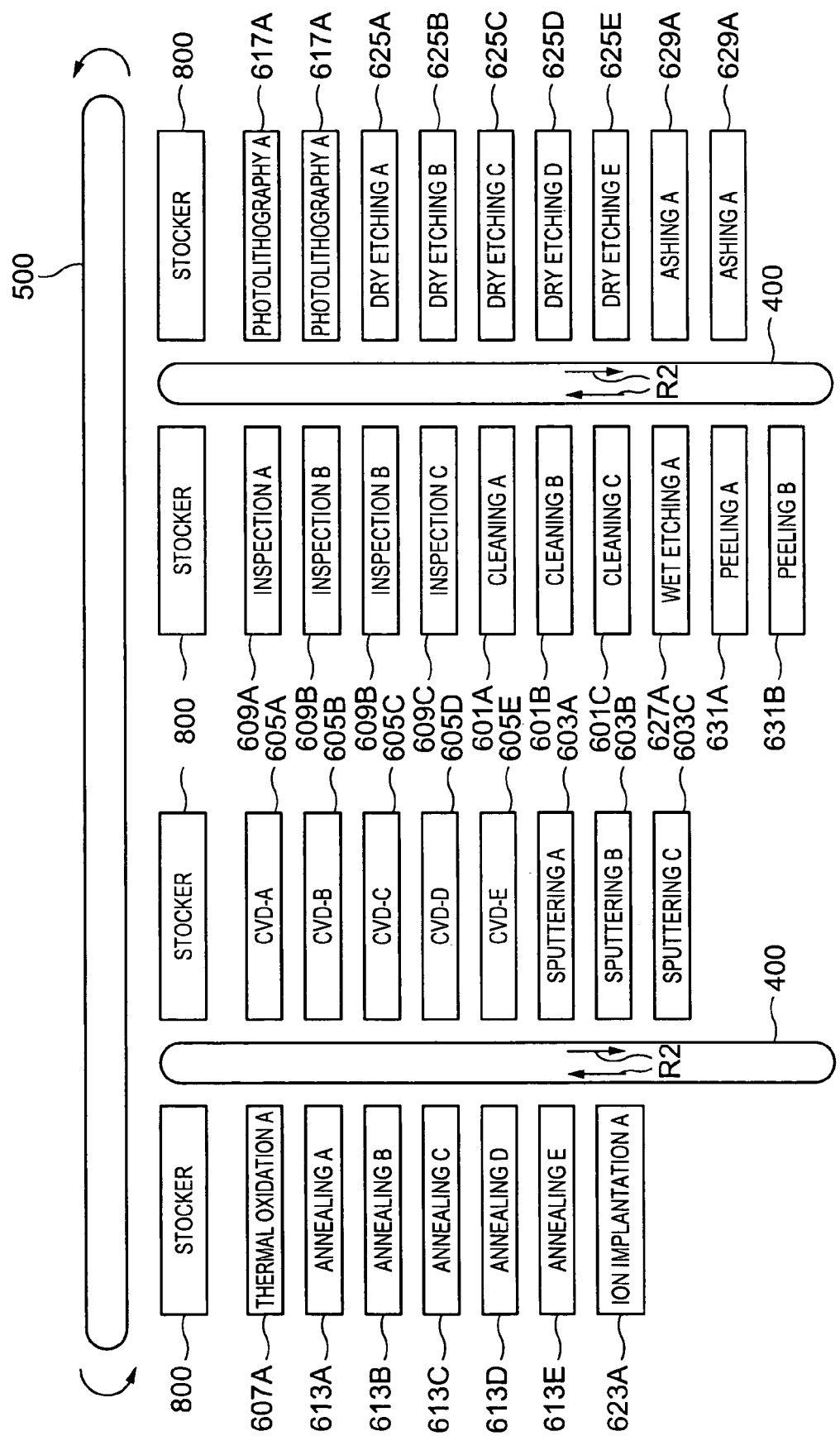
FIG. 13 is a diagram illustrating an example of a layout of the processing apparatuses in accordance with the job-shop.
Figure 14:
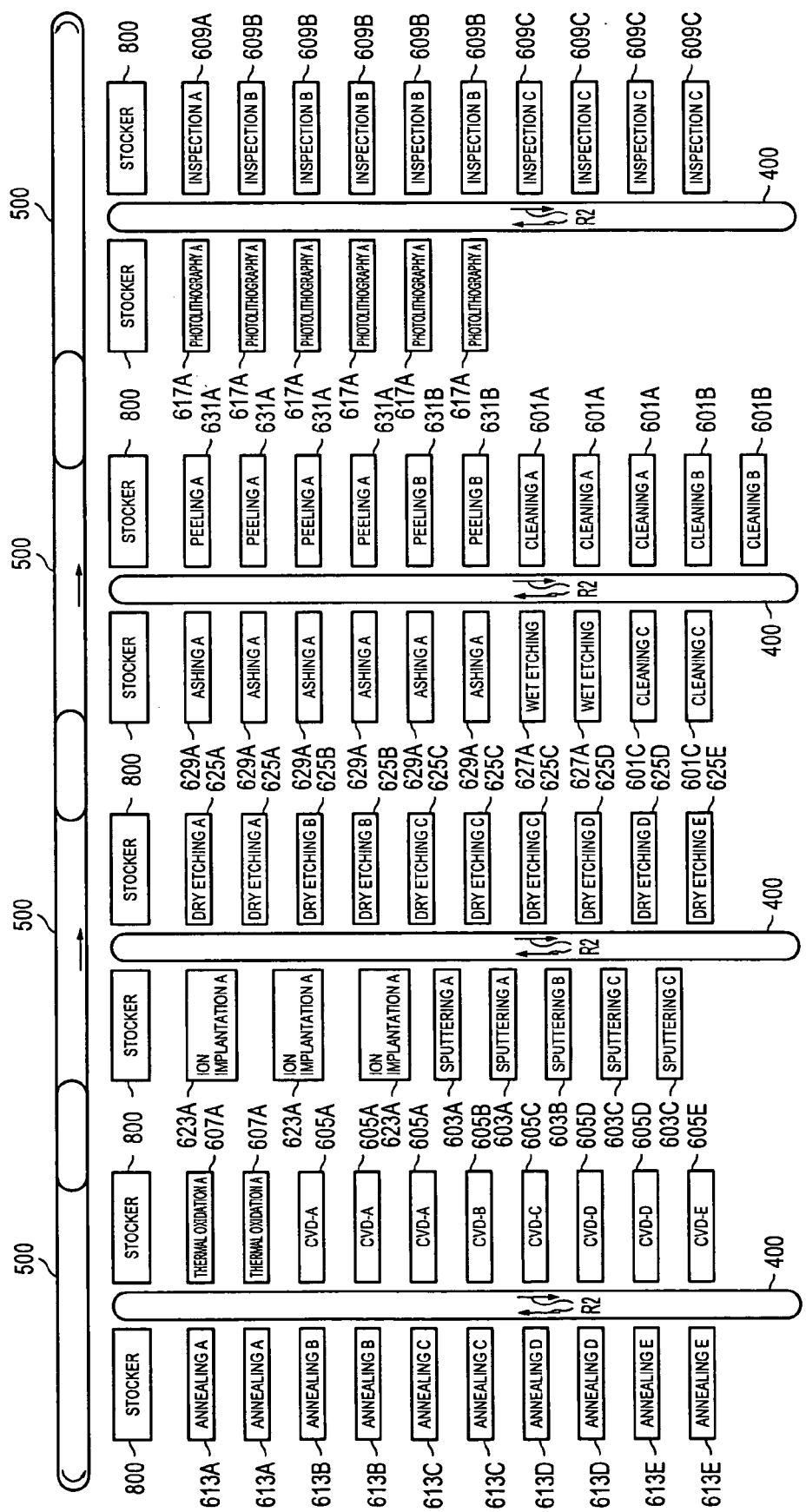
FIG. 14 is a diagram illustrating an example of a layout of the processing apparatuses in accordance with the job-shop.

FIGS. 13 and 14 are layout diagrams illustrating an example of a case in which the processing apparatuses are arranged in accordance with the job-shop, respectively. FIG. 13 illustrates a case in which for example, 2,500 sheets of semiconductor wafers are processed within a predetermined time interval, and FIG. 14 illustrates a case in which for example, 10,000 sheets of semiconductor wafers are processed.

As shown in FIG. 13, as for the processing apparatuses arranged in accordance with the job-shop, a plurality of processing apparatuses 607A, 613A, etc., for performing the same kinds of processes on the semiconductor wafers are arranged in a group. In this job-shop aspect, the semiconductor wafers carried by the inter-process carrying system 500 are acquired by stockers 800 having the loader, and are then carried within the process modules by the intra-bay carrying system 400.

The aforementioned processing apparatuses 605A, etc., are arranged at the outer circumferential side of the intra-bay carrying system 400 in accordance with the job-shop layout. Specifically, in the job-shop layout, for example, CVD apparatuses 605A, 605B, 605C, 605D, and 605E, sputtering apparatuses 603A, 603B, and 603C, an ion implantation apparatus 623A, annealing apparatuses 613A, 613B, 613C, 613D, and 613E, and a thermal oxidation apparatus 607A are arranged.

On the other hand, in a case in which, for example, 10,000 sheets of semiconductor wafers are manufactured within a predetermined time interval by employing the job-shop layout, the layout of the processing apparatuses is arranged as shown in FIG. 14. In the job-shop layout shown in FIG. 14, the processing apparatuses for performing the same kinds of processes to be performed on the semiconductor wafers are arranged in a group.

Specifically, in the job-shop layout, for example, thermal oxidation apparatuses 607A, 607A, etc., CVD apparatuses 605A, 605A, 605A, 605B, 605C, 605D, 605D, and 605E, and annealing apparatuses 613E, 613E, 613E, 613D, 613D, 613C, 613C, 613B, 613B, 613A, and 613A are arranged around the leftmost intra-bay carrying system 400. The processing apparatuses for performing the same kinds of processes to be performed on the semiconductor wafers are arranged in a group around other intra-bay carrying systems 400 as shown in FIG. 14.

FIG. 15 is a diagram illustrating an example of the number of processing apparatuses required in a case in which the processing apparatuses are arranged in accordance with the job-shop layout as shown in FIGS. 13 and 14. Referring to FIG. 15, in the case in which the processing apparatuses are arranged in accordance with the job-shop, the number of processing apparatuses required increases corresponding to the number of semiconductor wafers to be manufactured.

Next, a case in which the processing apparatuses are arranged in accordance with a flow-shop will be described. In this case in which the processing apparatuses are arranged in accordance with the flow-shop, a case of manufacturing, for example, 2,500 sheets of semiconductor wafers and a case of manufacturing, for example, 10,000 sheets of semiconductor wafers within a predetermined period of time will be exemplified.

FIG. 16 is a flowchart illustrating an example of a case in which the processes shown in FIG. 11 are classified into two flow-shops.

In the flowchart shown in FIG. 16, for example, a first flow-shop FS1 and a second flow-shop FS2 are included. The first flow-shop FS1 includes, for example, a cleaning process, a film forming process, an inspection process, a cleaning process, an annealing process, and a cleaning process. That is, in the first flow-shop FS1, the processing apparatuses corresponding to the above processes are arranged in the carrying direction of the semiconductor wafers within the first flow-shop FS1 in the order of processes to be performed on the semiconductor wafers. On the other hand, the second flow-shop FS2 includes a photolithography process, two inspection processes, an ion implantation process, two etching processes, an ashing process, a peeling process, and an inspection process. That is, in the second flow-shop FS2, the processing apparatuses corresponding to the above processes are arranged substantially in the carrying direction of the semiconductor wafers in the order of processes to be performed on the semiconductor wafers.

Figure 17:
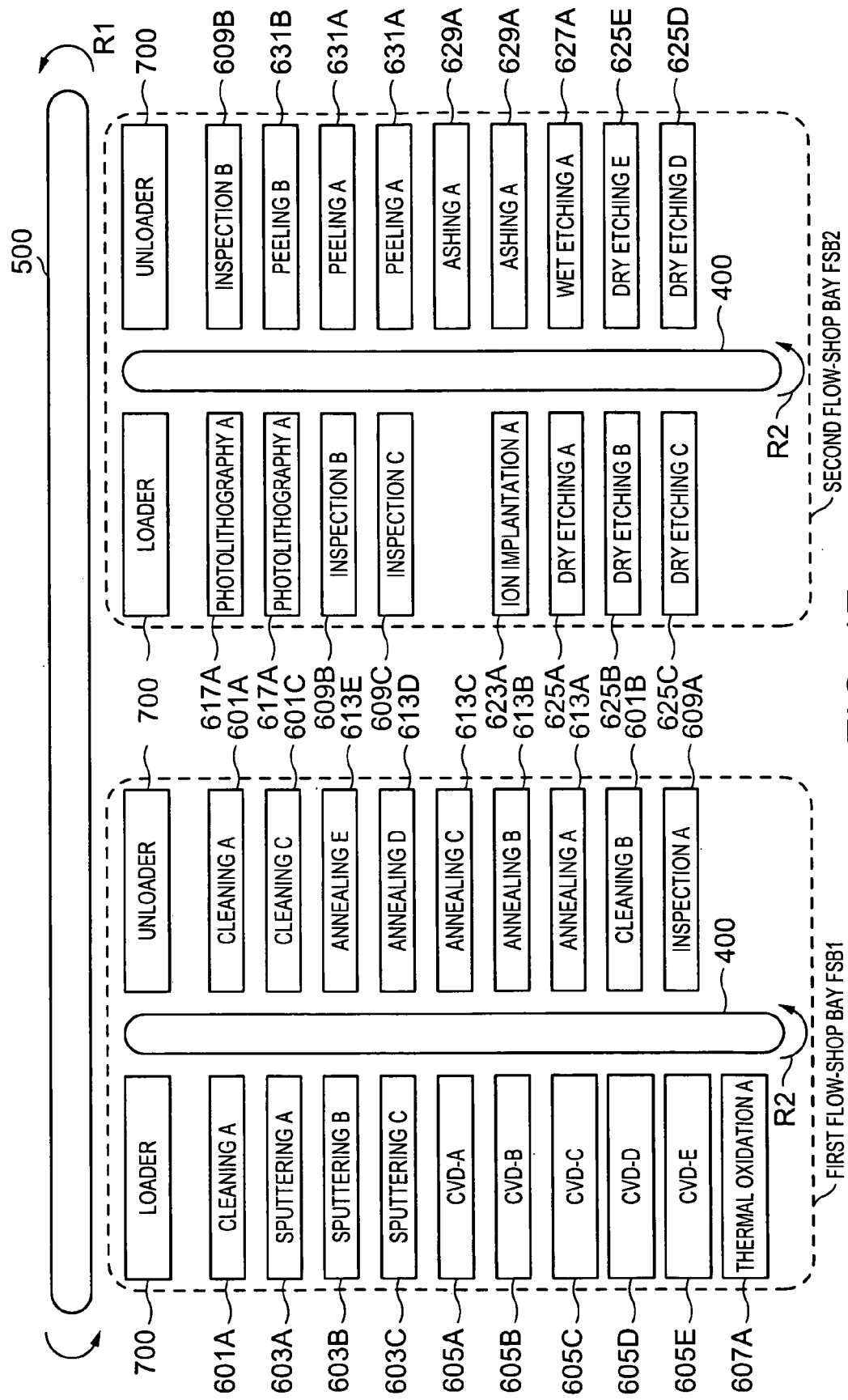
FIG. 17 is a diagram illustrating an example of a layout of the processing apparatuses in accordance with the flow-shop shown in FIG. 16.

By arranging the processing apparatuses in accordance with the first flow-shop FS1 and the second flow-shop FS2, the layout shown in FIG. 17 is obtained. According to the layout shown in FIG. 17, the processing apparatuses are arranged substantially in the carrying direction R2 of the semiconductor wafers in the order of processes to be performed on the semiconductor wafers.

That is, according to the layout shown in FIG. 17, it can be seen that the processing apparatuses for performing the same kinds of processes to be performed on the semiconductor wafers are not arranged in a group. Specifically, in the intra-bay carrying system 400 shown at the left side of FIG. 17, for example, a cleaning apparatus 601A and a cleaning apparatus 601C for performing the same kinds of processes are not arranged in a group, but are arranged in the carrying direction R2 of the semiconductor wafers in the order of processes to be performed on the semiconductor wafers. In addition, the second flow-shop bay FSB2 has the same arrangement.

The number of processing apparatuses required in the first flow-shop bay FSB1 shown at the left side of FIG. 17 is equal to the number of apparatuses shown in FIG. 18(A). On the other hand, the number of processing apparatuses required in the second flow-shop bay FSB2 shown at the right side of FIG. 17 is equal to, for example, the number of apparatuses shown in FIG. 18(B). The number of processing apparatuses shown in FIG. 18(A) is the sum of the number of the processing apparatuses included in the first flow-shop bay FSB1 shown at the left side of FIG. 17, and the number of processing apparatuses shown in FIG. 18(B) is the sum of the number of the processing apparatuses included in the second flow-shop bay FSB2 shown at the right side of FIG. 17.

Next, in the case in which the processing apparatuses are arranged in accordance with the flow-shop, for example, a case in which 10,000 sheets of semiconductor wafers are manufactured per month will be described.

FIG. 19 is a flowchart illustrating an example of the flow-shop in which the processing apparatuses included in the flowchart shown in FIG. 11 are classified into four groups.

The flowchart shown in FIG. 19 includes a first flow-shop FS1, a second flow-shop FS2, a third flow-shop FS3, and a fourth flow-shop FS4. The first flow-shop FS1 includes, for example, a cleaning process, a film forming process, and an inspection process. The second flow-shop FS2 includes, for example, a cleaning process, an annealing process, and a cleaning process. The third flow-shop FS3 includes, for example, a photolithography process, two inspection processes, and an ion implantation process. The fourth flow-shop FS4 includes, for example, two etching processes, an ashing process, a peeling process, and an inspection process.

Figure 20:
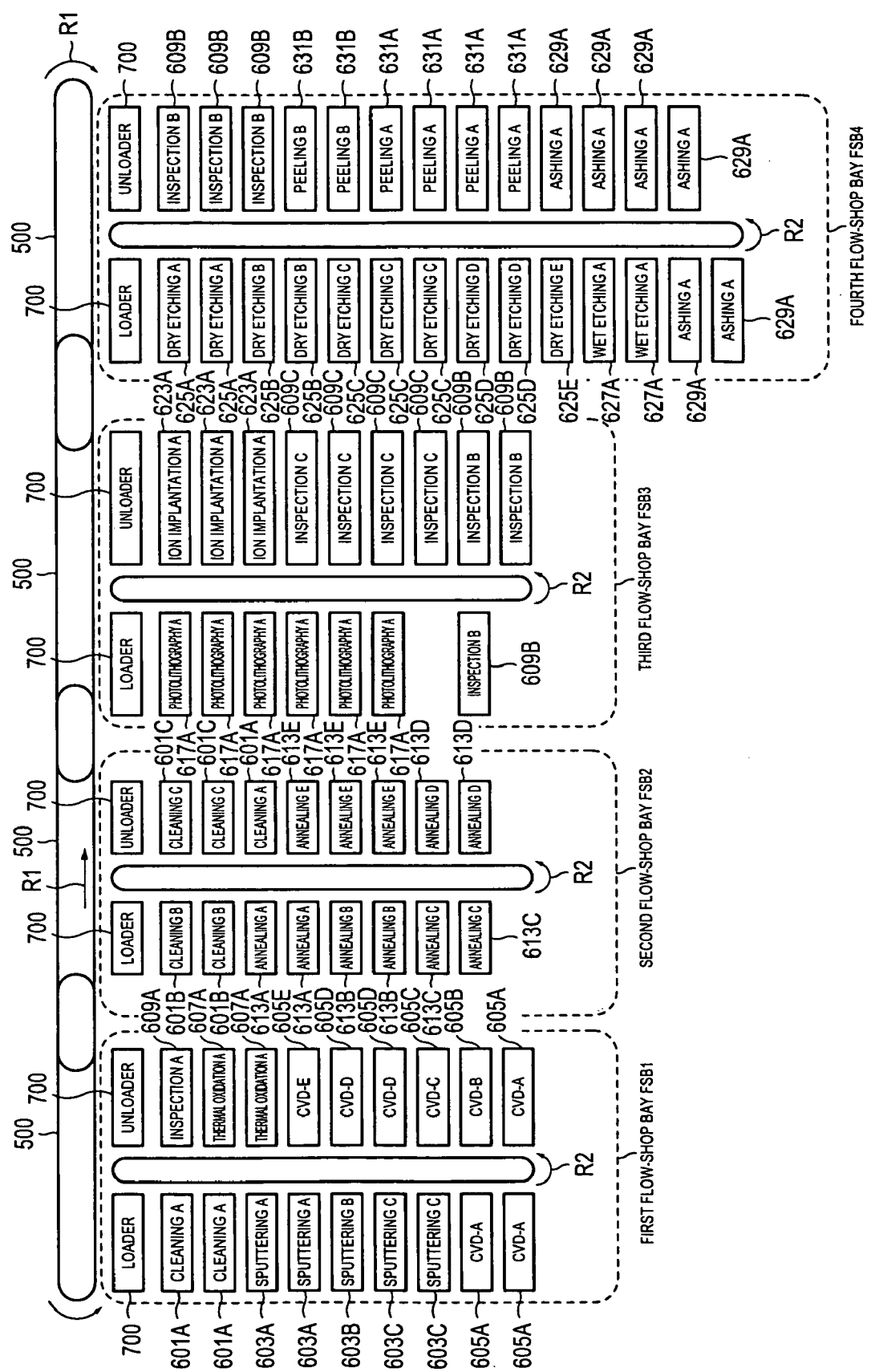
FIG. 20 is a diagram illustrating an example of a layout of the processing apparatuses in accordance with the flow-shop shown in FIG. 19.

By arranging the processing apparatuses in accordance with the flow-shop process shown in FIG. 19, the layout shown in FIG. 20 is obtained.

The layout shown in FIG. 20 includes a first flow-shop bay FSB1, a second flow-shop bay FSB2, a third flow-shop bay FSB3, and a fourth flow-shop bay FSB4.

The first flow-shop bay FSB1, etc., shown in FIG. 20, is an example of an arrangement of the processing apparatuses arranged corresponding to the first flow-shop FS1 shown in FIG. 19. For example, in the first flow-shop bay FSB1 shown in FIG. 20, as described above, the processing apparatuses are arranged substantially in the carrying direction R2 1 of the semiconductor wafers in the order of processes to be performed on the semiconductor wafers.

The second flow-shop bay FSB2, the third flow-shop bay FSB3, and the fourth flow-shop bay FSB4 have the similar arrangements. The number of processing apparatuses required in the respective flow-shop bays arranged as described above is equal to the number of apparatuses shown in FIG. 21. Specifically, the number of processing apparatuses as shown in FIG. 21(A), etc., is required for the first flow-shop bay FSB1, etc., shown in FIG. 20.

Figure 22:
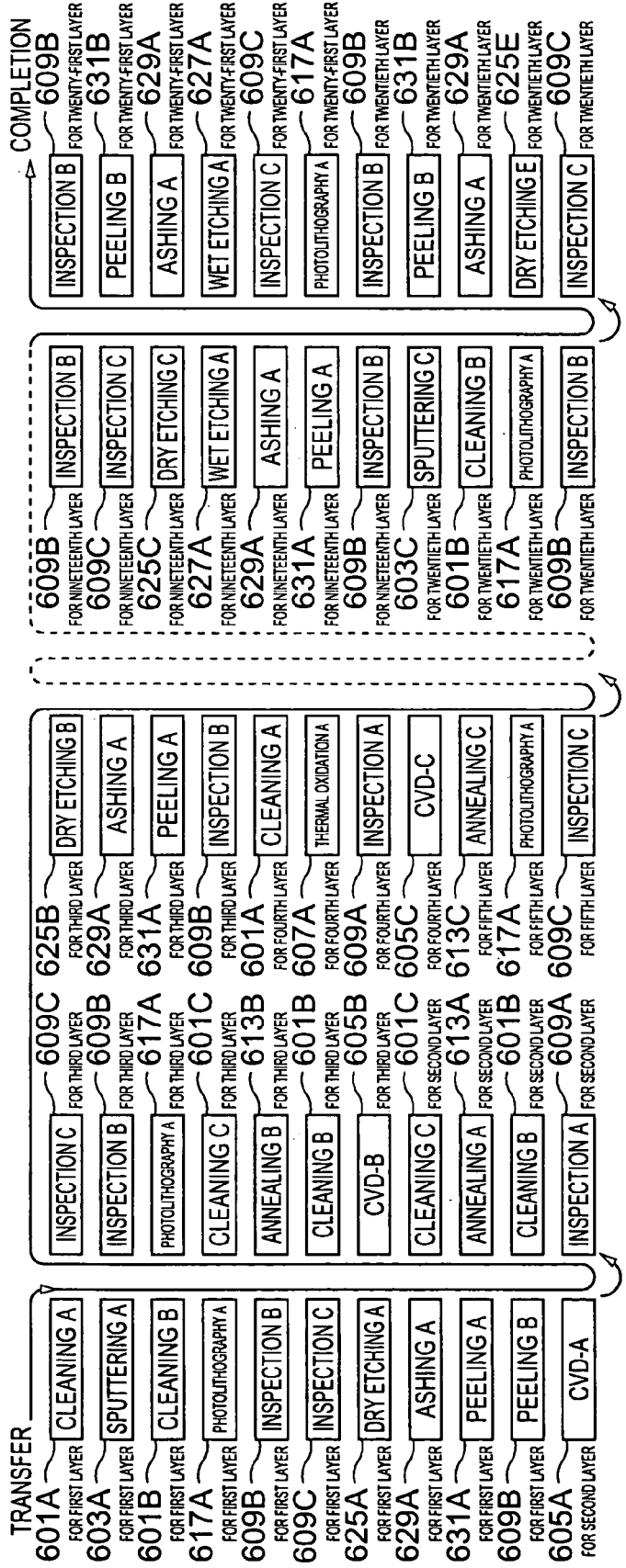
FIG. 22 is a diagram illustrating an example of a layout of the processing apparatuses in accordance with the complete flow-shop.

Next, instead of arranging the essential processing apparatuses as in the present embodiment, a case in which all of the processing apparatuses required for processing the semiconductor wafers are arranged in the order of all of the processes will be described. It is called a 'complete flow-shop' in which all of the processing apparatuses corresponding to all of the necessary processes on the semiconductor wafers are arranged in the carrying direction of the semiconductor wafers in the order of processes to be performed on the semiconductor wafers. FIG. 22 is a diagram illustrating an example of a case in which the processing apparatuses are arranged in accordance with the complete flow-shop.

The layout shown in FIG. 22 is characterized in that all of the processing apparatuses are arranged in the order of processes to be performed on the semiconductor wafers as described above, and in that the processing apparatuses for performing similar processes are repeatedly arranged. That is, since the processing apparatuses arranged in accordance with the complete flow-shop shown in FIG. 22 cannot perform all of the processes on the semiconductor wafers through one circulation, and thus a plurality of processing apparatuses for performing similar processes are all required to be arranged, the layout of the processing apparatuses may be inefficient.

As many processing apparatuses as shown in FIG. 23 are required for the layout in accordance with the complete flow-shop shown in FIG. 22. As can be seen from FIG. 23, in a case in which the processing apparatuses are arranged in accordance with the complete flow-shop, the number of processing apparatuses to be additionally provided corresponding to the number of semiconductor wafers to be manufactured is not substantially changed, but even in a case in which the number of semiconductor wafers to be manufactured is small, it can be known that considerably many processing apparatuses are required.

That is, in a case in which the processing apparatuses are arranged in accordance with the complete flow-shop, there is a problem in that a large number of processing apparatuses are required even when the number of semiconductor wafers to be manufactured is small.

FIG. 24 is a diagram illustrating an example of the number of processing apparatuses required when the semiconductor wafers are manufactured in accordance with a job-shop, a complete flow-shop, and a flow-shop according to the present embodiment. The apparatuses shown longitudinally at the left side of FIG. 24 are the processing apparatuses for performing processes on the semiconductor wafers, and corresponding to the processing apparatuses, the number of processing apparatuses required in a case in which, for example, 2,500 sheets of semiconductor wafers are manufactured per month on a small scale and in a case in which, for example, 10,000 sheets of semiconductor wafers are manufactured per month on a middle scale are shown.

From the viewpoint of efficiently performing the processes on the semiconductor wafers, in a case in which the processing apparatuses are arranged in accordance with a job-shop, performance is inferior, but, as can be seen from FIG. 24, the number of necessary processing apparatuses may be small. On the other hand, in a case in which the processing apparatuses are arranged in accordance with a complete flow-shop, since the number of processing apparatuses increases corresponding to the number of processes to be performed on the semiconductor wafers, a large number of processing apparatuses are necessary.

On the other hand, in cases in which the present embodiment is employed, it can be known that it is possible to efficiently perform the processes on the semiconductor wafers with a small number of apparatuses rather than by using substantially as many processing apparatuses as those required for the job-shop. This can be known by referring to the total number of apparatuses shown at the lower side of FIG. 24, as well as considering the respective processing apparatuses. Specifically, as can be seen from the sum of FIG. 24, in the case of the small-scale production, for example, thirty-four processing apparatuses are required for cases arranged according to the job-shop, while, for example, thirty-five processing apparatuses are required for cases arranged according to the present embodiment.

That is, the number of processing apparatuses required in the present embodiment is substantially equal to the number of processing apparatuses arranged in accordance with the job-shop, but it is possible to perform the processes on the semiconductor wafers as efficiently as when using the complete flow-shop.

In addition, in a case of the mid-scale production, as shown at the right side of FIG. 24, it can be known that, for example, seventy-six processing apparatuses are required in cases arranged according to the job-shop, while, for example, seventy-seven processing apparatuses are required in cases arranged according to the present embodiment.

That is, the number of processing apparatuses required in cases in which the processing apparatuses are arranged according to this embodiment is substantially equal to the number of processing apparatuses required in cases arranged according to the job-shop, but it is possible to perform the processes on the semiconductor wafers as efficiently as when using the complete flow-shop even when the number of semiconductor wafers to be produced increases.

Therefore, according to the embodiments of the present invention, it can be known that the number of new processing apparatuses to be additionally provided may not increase even if the number of processes on the semiconductor wafers to be manufactured increases as described above.

The present invention is not limited to the embodiments described above, and can be subjected to a variety of changes without departing from the scope of the appended claims. For example, in the constructions of the embodiments described above, some parts thereof may be omitted, or may be arbitrarily combined unlike those of the above description.

What is claimed is:

1. A manufacturing apparatus for manufacturing an intermediate product, the apparatus comprising:
   a plurality of process modules each performing a plurality of processes; and
   an inter-process carrying means for carrying a container between the plurality of process modules, the container being capable of storing a plurality of intermediate products therein, and the inter-process carrying means including at least one of an automatic carrying robot and an automatic carrying vehicle;
   a plurality of loaders, each loader being capable of acquiring the container from the inter-process carrying means, removing the intermediate products stored in the container, and transferring the intermediate products to one of the process modules in a single product state;
   wherein each process module includes:
      an intra-process carrying conveyor arranged radially from the inter-process carrying means for carrying the intermediate products within the process module in the single product state in a carrying direction, the intra-process carrying conveyor having a first side, which carries the intermediate products away from the inter-process carrying means, connected to a second side, which carries the intermediate products towards the inter-process carrying means; and
      a plurality of processing means for performing the plurality of processes, respectively, within each process module, each processing means having a robot for acquiring and returning the intermediate products to the intra-process carrying means, and a mini-buffer for temporarily storing the intermediate products;
   wherein the plurality of processing means are arranged along the first side of the intra-process carrying conveyor at locations corresponding to an order of processes to be performed on the intermediate products, and arranged along the second side of the intra-process carrying conveyor at locations corresponding to the order of processes to be performed on the intermediate products, without arranging a plurality of processing means for performing the same kinds of processes on the intermediate products in a group, wherein a sequence of the locations of the plurality of processing means along the first and second sides of the intra-process carrying conveyor corresponds to a sequence of the order of processes to be performed on the intermediate products by the plurality of processing means;

wherein the series of processes to be performed on the intermediate products is completed during a single circulation of the intermediate products on the intra-process conveyor along the first side and the second side of the intra-process carrying conveyor by first performing processes, according to the sequence of the order of processes, with the processing means arranged along the first side and, after performing the processes with the processing means arranged along the first side, then performing processes, according to the sequence of the order of processes, with the plurality of processing means arranged along the second side; and wherein, after completion of the series of processes, the intermediate products are loaded into the container and returned to the inter-process carrying means.

2. The manufacturing apparatus according to claim 1, wherein the loader has a buffering function of temporarily storing the intermediate products to be transferred therein.

3. The manufacturing apparatus according to claim 1, wherein the inter-process carrying means is adapted to carry a container before the maximum number of intermediate products capable of being stored in the container is reached, and the loader selects the plurality of intermediate products to be processed in the same next process module, stores the selected intermediate products in the container in a group, and transfers the container to the inter-process carrying means.

4. The manufacturing apparatus according to claim 1, wherein the intermediate products comprise plate-shaped members.

5. The manufacturing apparatus according to claim 4, wherein the intermediate products comprise semiconductor wafers.

6. The manufacturing apparatus according to claim 4, wherein the intermediate products comprise substrates for liquid crystal display devices.

7. A manufacturing method of manufacturing an intermediate product via process modules, each performing a plurality of processes, the method comprising:

an inter-process carrying step of carrying a container between the process modules with inter-process carrying means that include at least one of an automatic carrying robot and an automatic carrying vehicle, the container being capable of storing a plurality of intermediate products therein;

a loading step of acquiring the container, removing the intermediate products stored in the container, and transferring the intermediate products to one of the process modules in a single product state;

an intra-process carrying step of carrying the intermediate products within each process module on an intra-process conveyor in the single product state in a carrying direction, the intra-process conveyor being arranged radially from the inter-process carrying means and having a first side, which carries the intermediate products away from the inter-process carrying means, connected to a second side, which carries the intermediate products towards the inter-process carrying carrying means; and a processing step of performing the plurality of processes by a plurality of processing means, respectively, in each process module, wherein the plurality of processing means are arranged along the first side of the intra-process conveyor at locations corresponding to an order of processes to be performed on the intermediate products, and arranged along the second side of the intra-process carrying conveyor at locations corresponding to the order of processes to be performed on the intermediate products, without arranging the plurality of processing means for performing the same kinds of processes on the intermediate products in a group, wherein a sequence of the locations of the plurality of processing means along the first and second sides of the intra-process carrying conveyor corresponds to a sequence of the order of processes to be performed on the intermediate products by the plurality of processing means, wherein the series of processes to be performed on the intermediate products is completed during a single circulation of the intermediate products on the intra-process conveyor during the intra-process, carrying step by first performing processes, according to the sequence of the order of processes, with the processing means arranged along the first side and, after performing the processes with the processing means arranged along the first side, then performing processes, according to the sequence of the order of processes, with the plurality of processing means arranged along the second side, and wherein, after completion of the series of processes, the intermediate products are loaded into the container and carried to another process module.

* * * * *